United States Patent
Ushikura et al.

(10) Patent No.: US 11,624,844 B2
(45) Date of Patent: Apr. 11, 2023

(54) RADIATION DETECTOR AND RADIOGRAPHIC IMAGING APPARATUS

(71) Applicant: FUJIFILM CORPORATION, Tokyo (JP)

(72) Inventors: Shinichi Ushikura, Kanagawa (JP); Munetaka Kato, Kanagawa (JP); Tatsunori Tanimoto, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 3 days.

(21) Appl. No.: 17/556,920

(22) Filed: Dec. 20, 2021

(65) Prior Publication Data
US 2022/0113435 A1    Apr. 14, 2022

Related U.S. Application Data

(63) Continuation of application No. PCT/JP2020/026746, filed on Jul. 8, 2020.

(30) Foreign Application Priority Data

Jul. 9, 2019    (JP) .............................. JP2019-127738

(51) Int. Cl.
*G01T 1/20*    (2006.01)
*H04N 25/70*    (2023.01)

(52) U.S. Cl.
CPC .............. *G01T 1/20* (2013.01); *H04N 25/70* (2023.01)

(58) Field of Classification Search
CPC ....... G01T 1/20; G01T 1/20189; H04N 25/70; H01L 27/144; H01L 27/146; A61B 6/44; A61B 6/4208
See application file for complete search history.

(56) References Cited

U.S. PATENT DOCUMENTS

2014/0027637 A1    1/2014 Watano
2014/0070352 A1*    3/2014 Tsai .................... H01L 31/1804
                                                                    257/443
(Continued)

FOREIGN PATENT DOCUMENTS

EP    2857866 A1    4/2015
JP    2007-324502 A    12/2007
(Continued)

OTHER PUBLICATIONS

Extended European Search Report dated Jul. 1, 2022, issued in corresponding EP Patent Application No. 20837621.0.
(Continued)

*Primary Examiner* — Kiho Kim
(74) *Attorney, Agent, or Firm* — SOLARIS Intellectual Property Group, PLLC

(57) ABSTRACT

In a sensor substrate, a plurality of pixels are formed in a pixel region of a first surface of a flexible base material, and a terminal portion for electrically connecting a cable is provided in the terminal region of the first surface. A conversion layer is provided outside the terminal region of the base material and converts radiation into light. A reinforcing member is provided on a second surface of the base material to reinforce the strength of the base material. A stress neutral plane adjusting member is provided inside the terminal region and in at least a part, corresponding to the inside of the terminal region, of a cable electrically connected to the terminal portion.

14 Claims, 18 Drawing Sheets

(56) References Cited

U.S. PATENT DOCUMENTS

| | | | |
|---|---|---|---|
| 2014/0103216 A1* | 4/2014 | Sasaki | G01T 1/202 |
| | | | 250/361 R |
| 2014/0374608 A1 | 12/2014 | Sasaki et al. | |
| 2018/0313962 A1 | 11/2018 | Ushikura et al. | |

FOREIGN PATENT DOCUMENTS

| | | |
|---|---|---|
| JP | 2014-025847 A | 2/2014 |
| JP | 2015-004550 A | 1/2015 |
| JP | 2018-119891 A | 8/2018 |
| JP | 2020-134274 A | 8/2020 |
| KR | 20100043654 A | 4/2010 |
| WO | 2018/173894 A1 | 9/2018 |

OTHER PUBLICATIONS

English language translation of the following: Office action dated Dec. 6, 2022 from the JPO in a Japanese patent application No. 2021-530722 corresponding to the instant patent application. This office action translation is submitted now in order to supplement the understanding of the cited references which are being disclosed in the instant Information Disclosure Statement.

International Search Report issued in International Application No. PCT/JP2020/026746 dated Oct. 6, 2020.

Written Opinion of the ISA issued in International Application No. PCT/JP2020/026746 dated Oct. 6, 2020.

\* cited by examiner

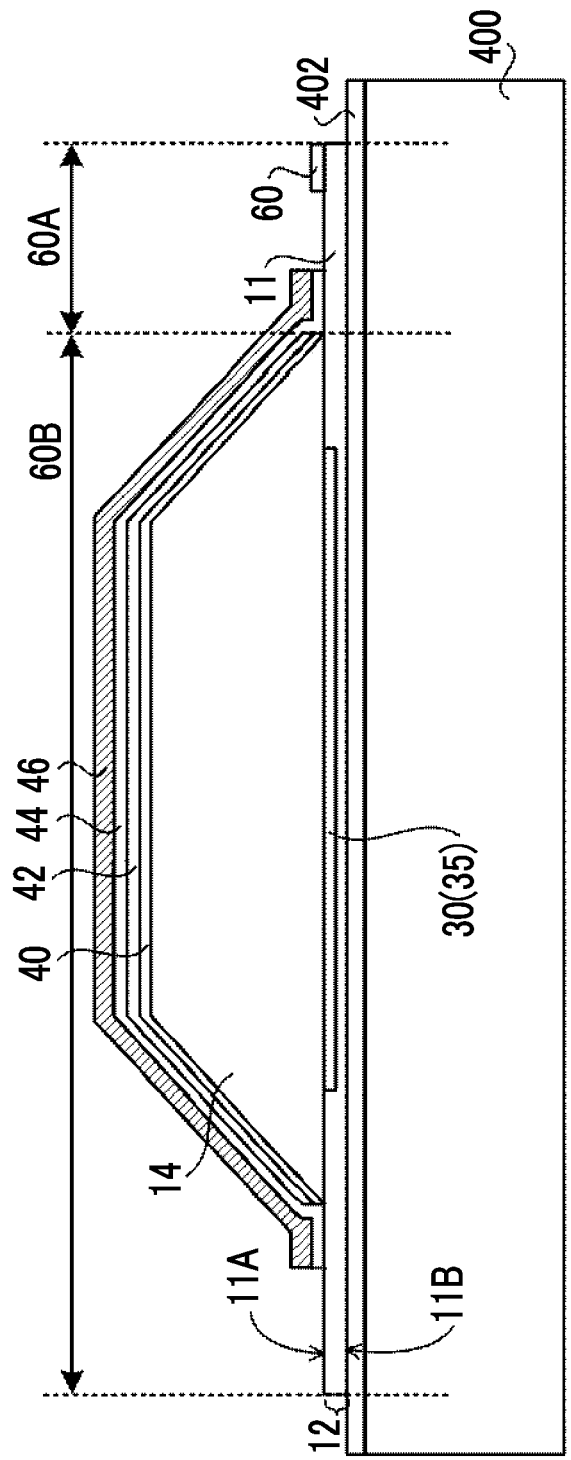

RADIATION DETECTOR AND RADIOGRAPHIC IMAGING APPARATUS

CROSS-REFERENCE TO RELATED APPLICATION

This application is a continuation application of International Application No. PCT/JP2020/026746, filed Jul. 8, 2020, the disclosure of which is incorporated herein by reference in its entirety. Further, this application claims priority from Japanese Patent Application No. 2019-127738 filed on Jul. 9, 2019, the disclosure of which is incorporated herein by reference in its entirety.

BACKGROUND

1. Technical Field

The present invention relates to a radiation detector and a radiographic imaging apparatus.

2. Description of the Related Art

In the related art, radiographic imaging apparatuses that perform radiographic imaging for medical diagnosis have been known. A radiation detector for detecting radiation transmitted through a subject and generating a radiographic image is used for such radiographic imaging apparatuses.

As the radiation detector, there is one comprising a conversion layer, such as a scintillator, which converts radiation into light, and a substrate in which a plurality of pixels, which accumulate electric charges generated depending on light converted in the conversion layer, are provided.

There is a case in which a force is applied in a direction in which an end portion of the radiation detector warps, and problems that stress is applied a cable electrically connected to the end portion of the radiation detector and the electrical connection between the radiation detector and the cable is disconnected are known. As a technique for addressing the problems, for example, in the technique described in JP2018-119891A, the warping of an end portion of a radiation detector is suppressed by fixing an end portion of the radiation detector and a cable (flexible wiring substrate) to a side surface of a base.

SUMMARY

Meanwhile, as the radiation detector, one using a flexible base material for the substrate is known. By using the flexible base material, for example, there is a case in which the weight of the radiation detectors and the radiographic imaging apparatuses can be reduced, and a subject is easily imaged.

The substrate using the flexible base material is easily deflected. In particular, in the middle of a manufacturing process for the radiographic imaging apparatuses, the substrate tends to be deflected in a state where the cable is electrically connected to a terminal portion provided in the radiation detector. In the technique described in JP2018-119891A, there is a case where the warping (deflection) in the radiation detector provided with the substrate using the flexible base material cannot be sufficiently suppressed.

The present disclosure provides a radiation detector and a radiographic imaging apparatus capable of easily suppressing the disconnection of an electrical connection between a cable and a terminal portion.

A radiation detector of a first aspect of the present disclosure comprises a substrate in which a plurality of pixels that accumulate electric charges generated in response to light converted from radiation are formed in a pixel region of a first surface of a flexible base material and a terminal region of the first surface is provided with a terminal portion for electrically connecting a cable; a conversion layer that is provided outside the terminal region on the first surface of the base material to convert the radiation into light; a reinforcing member that is provided on a second surface of the base material opposite to the first surface to reinforce strength of the base material; and a stress neutral plane adjusting member that is provided in at least a part, corresponding to an inside of the terminal region, of the cable electrically connected to the terminal portion and adjusts a position of a stress neutral plane in a region corresponding to a laminate in which the reinforcing member, the terminal portion of the substrate, and the cable electrically connected to the terminal portion are laminated.

Additionally, the radiation detector of a second aspect of the present disclosure is the radiation detector of the first aspect in which the stress neutral plane adjusting member adjusts a position of the stress neutral plane in a lamination direction of the laminate to be within a predetermined range from an interface where the cable is electrically connected to the terminal portion.

Additionally, the radiation detector of a third aspect of the present disclosure is the radiation detector of the second aspect in which the position to be within the predetermined range is a position in the laminate.

Additionally, the radiation detector of a fourth aspect of the present disclosure is the radiation detector of any one of the first to third aspects in which a bending stiffness of the stress neutral plane adjusting member is 540 Pacm$^4$ or more and 140,000 Pacm$^4$ or less.

Additionally, the radiation detector of a fifth aspect of the present disclosure is the radiation detector of any one of the first to fourth aspects in which the stress neutral plane adjusting member has a bending elastic modulus of 150 MPa or more and 2,500 MPa or less.

Additionally, the radiation detector of a sixth aspect of the present disclosure is the radiation detector of any one of the first to fifth aspects in which a plurality of the terminal portions are provided on the substrate, and the stress neutral plane adjusting member is provided over at least one or more of the terminal portions.

Additionally, the radiation detector of a seventh aspect of the present disclosure is the radiation detector of any one of the first to sixth aspects further comprising a strengthening member that strengthens an electrical connection between the cable and the terminal portion, and the stress neutral plane adjusting member is provided on at least a part of the cable covered with the strengthening member.

Additionally, the radiation detector of an eighth aspect of the present disclosure is the radiation detector of the seventh aspect in which the strengthening member further has moistureproofness.

Additionally, the radiation detector of a ninth aspect of the present disclosure is the radiation detector of any one of the first to sixth aspects in which the stress neutral plane adjusting member further strengthens an electrical connection between the cable and the terminal portion.

Additionally, the radiation detector of a tenth aspect of the present disclosure is the radiation detector of the ninth aspect in which the stress neutral plane adjusting member further has moistureproofness.

Additionally, the radiation detector of an eleventh aspect of the present disclosure is the radiation detector of any one of the first to tenth aspects in which the stress neutral plane adjusting member is further applied to an end portion of the conversion layer.

Additionally, the radiation detector of a twelfth aspect of the present disclosure is the radiation detector of any one of the first to eleventh aspects further comprising a reinforcing layer that is provided on a surface of the conversion layer opposite to a surface on the base material side and has a higher stiffness than the base material.

Additionally, a radiographic imaging apparatus according to a thirteenth aspect of the present disclosure comprises the radiation detector according to any one of the first to twelfth aspects; a controller that outputs a control signal for reading out the electric charges accumulated in the plurality of pixels; a driver that is electrically connected to the terminal portion of the radiation detector via a cable and outputs a drive signal for reading out electric charges from the plurality of pixels in response to the control signal; and a signal processor that is electrically connected to the terminal portion of the radiation detector via the cable, receives electrical signals according to the electric charges read from the plurality of pixels, and generates image data according to the received electrical signals to output the image data.

The radiographic imaging apparatus according to a fourteenth aspect of the present disclosure based on the radiographic imaging apparatus according to the thirteenth aspect further comprising a housing that has an irradiation surface to be irradiated with radiation and houses the radiation detector in a state where a sensor substrate out of the sensor substrate and a conversion layer in the radiation detector faces the irradiation surface.

According to the present disclosure, it is possible to easily suppress the disconnection of the electrical connection between the cable and the terminal portion.

BRIEF DESCRIPTION OF THE DRAWINGS

Exemplary embodiments according to the technique of the present disclosure will be described in detail based on the following figures, wherein:

FIG. 6A is a view illustrating an example of a method of manufacturing the radiation detector of the embodiment.

DETAILED DESCRIPTION

Hereinafter, embodiments of the present invention will be described in detail with reference to the drawings. In addition, the present embodiments do not limit the present invention.

The radiation detector of the present embodiment has a function of detecting radiation transmitted through a subject to output image information representing a radiographic image of the subject. The radiation detector of the present embodiment comprises a sensor substrate and a conversion layer that converts radiation into light (refer to a sensor substrate 12 and a conversion layer 14 of the radiation detector 10 in FIG. 2). The sensor substrate 12 of the present embodiment is an example of a substrate of the present disclosure.

Figure 1:
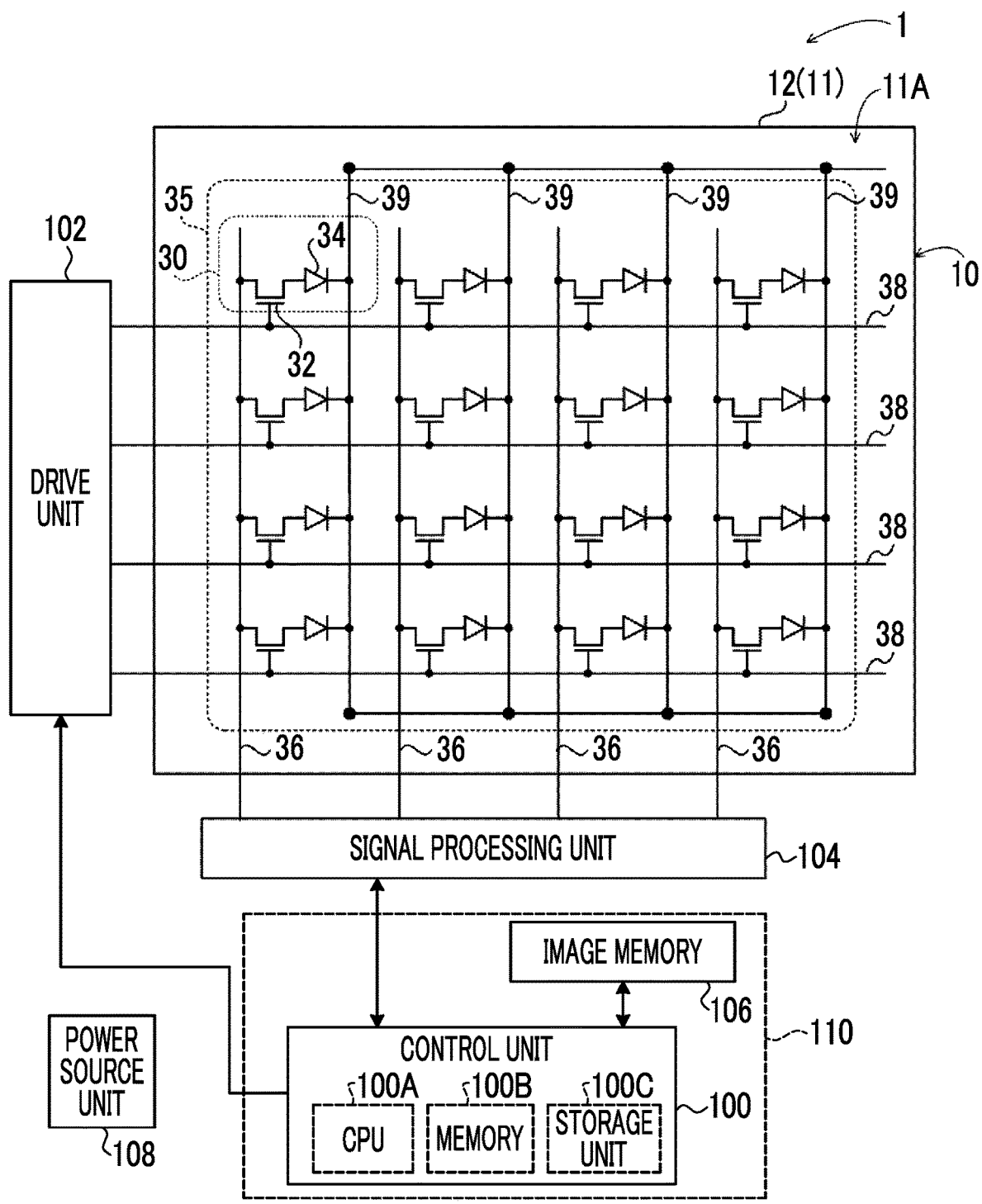
FIG. 1 is a block diagram showing an example of the configuration of major parts of an electrical system in a radiographic imaging apparatus of an embodiment.

First, the outline of an example of the configuration of an electrical system in a radiographic imaging apparatus of the present embodiment will be described with reference to FIG. 1. FIG. 1 is a block diagram showing an example of the configuration of major parts of the electrical system in the radiographic imaging apparatus of the present embodiment.

As shown in FIG. 1, the radiographic imaging apparatus 1 of the present embodiment comprises the radiation detector 10, a controller 100, a driver 102, a signal processor 104, an image memory 106, and a power source unit 108.

The radiation detector 10 comprises a sensor substrate 12 and a conversion layer (refer to FIG. 2) that converts radiation into light. The sensor substrate 12 comprises a flexible base material 11, and a plurality of pixels 30 provided on a first surface 11A of the base material 11. In addition, in the following description, the plurality of pixels 30 may be simply referred to as "pixels 30".

As shown in FIG. 1, each pixel 30 of the present embodiment comprises a sensor unit 34 that generates and accumulates electric charges in response to the light converted by the conversion layer, and a switching element 32 that reads out the electric charges accumulated in the sensor unit 34. In the present embodiment, as an example, a thin film transistor (TFT) is used as the switching element 32. For that reason, in the following description, the switching element 32 is referred to as a "TFT 32". In the present embodiment, a layer in which the pixels 30 are formed on the first surface 11A of the base material 11 is provided as a layer that is formed with the sensor unit 34 and the TFT 32 and is planarized.

The pixels 30 are two-dimensionally arranged in one direction (a scanning wiring direction corresponding to a transverse direction of FIG. 1, hereinafter referred to as a "row direction"), and a direction intersecting the row direction (a signal wiring direction corresponding to the longitudinal direction of FIG. 1, hereinafter referred as a "column direction") in a pixel region 35 of the sensor substrate 12. Although an array of the pixels 30 is shown in a simplified manner in FIG. 1, for example, 1024×1024 pixels 30 are arranged in the row direction and the column direction.

Additionally, a plurality of scanning wiring lines 38, which are provided for respective rows of the pixels 30 to control switching states (ON and OFF) of the TFTs 32, and a plurality of signal wiring lines 36, which are provided for respective columns of the pixels 30 and from which electric charges accumulated in the sensor units 34 are read, are provided in a mutually intersecting manner in the radiation detector 10. Each of the plurality of scanning wiring lines 38 is connected to the driver 102 via a cable 112A (refer to FIG. 2), and thereby, a drive signal for driving the TFT 32 output from the driver 102 to control the switching state thereof flows through each of the plurality of scanning wiring lines 38. Additionally, the plurality of signal wiring lines 36 are electrically connected to the signal processor 104 via the cable 112B (refer to FIG. 2), respectively, and thereby, electric charges read from the respective pixels 30 are output to the signal processor 104 as electrical signals. The signal processor 104 generates and outputs image data according to the input electrical signals.

The controller 100 to be described below is connected to the signal processor 104, and the image data output from the signal processor 104 is sequentially output to the controller 100. The image memory 106 is connected to the controller 100, and the image data sequentially output from the signal processor 104 is sequentially stored in the image memory 106 under the control of the controller 100. The image memory 106 has a storage capacity capable of storing image data equivalent to a predetermined number of sheets, and whenever radiographic images are captured, image data obtained by the capturing is sequentially stored in the image memory 106.

The controller 100 comprises a central processing unit (CPU) 100A, a memory 100B including a read only memory (ROM), a random access memory (RAM), and the like, and a nonvolatile storage unit 100C, such as a flash memory. An example of the controller 100 is a microcomputer or the like. The controller 100 controls the overall operation of the radiographic imaging apparatus 1.

In addition, in the radiographic imaging apparatus 1 of the present embodiment, the image memory 106, the controller 100, and the like are formed in a control substrate 110.

Additionally, common wiring lines 39 are provided in a wiring direction of the signal wiring lines 36 at the sensor units 34 of the respective pixels 30 in order to apply bias voltages to the respective pixels 30. Bias voltages are applied to the respective pixels 30 from a bias power source by electrically connecting the common wiring lines 39 to the bias power source (not shown) outside the sensor substrate 12.

The power source unit 108 supplies electrical power to various elements and various circuits, such as the controller 100, the driver 102, the signal processor 104, the image memory 106, and the power source unit 108. In addition, in FIG. 1, an illustration of wiring lines, which connect the power source unit 108 and various elements or various circuits together, is omitted in order to avoid complications.

Figure 2:
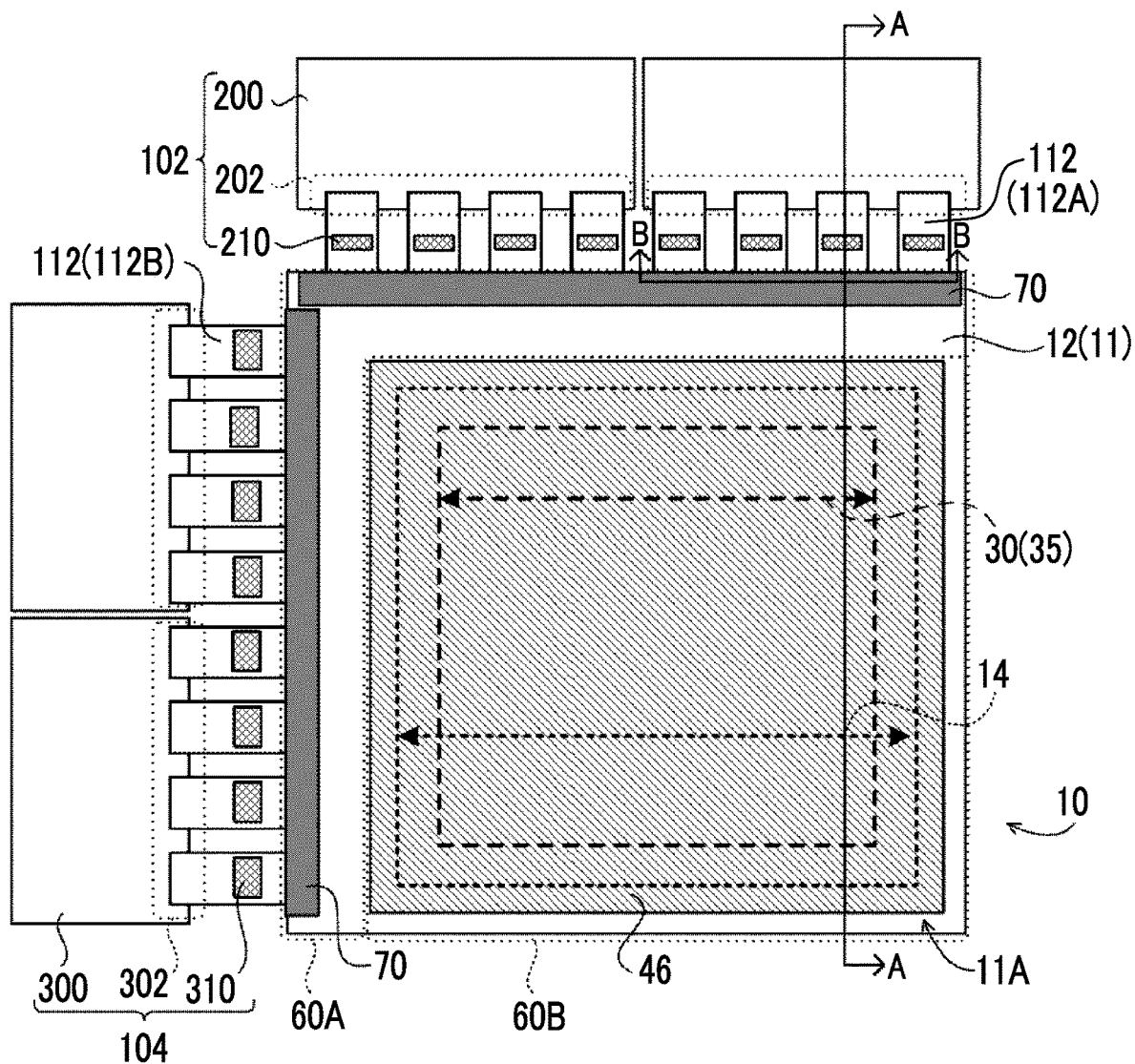
FIG. 2 is a plan view of an example of a radiation detector according to the embodiment as seen from a first surface side of a base material.
Figure 3A:
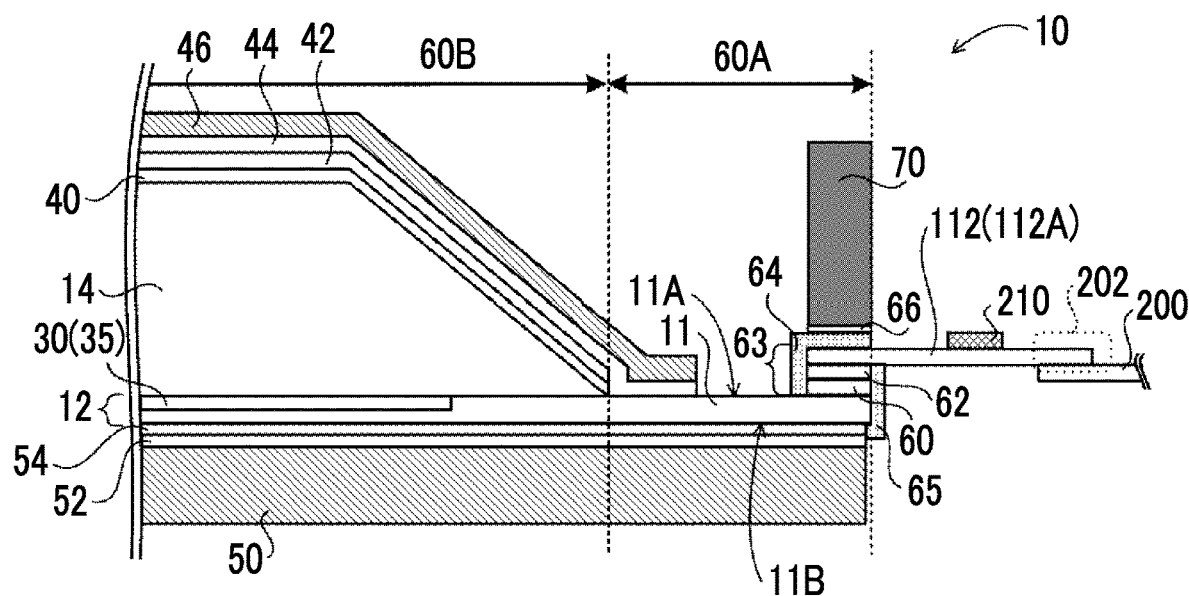
FIG. 3A is a cross-sectional view taken along line A-A of the radiation detector illustrated in FIG. 2.
Figure 3B:
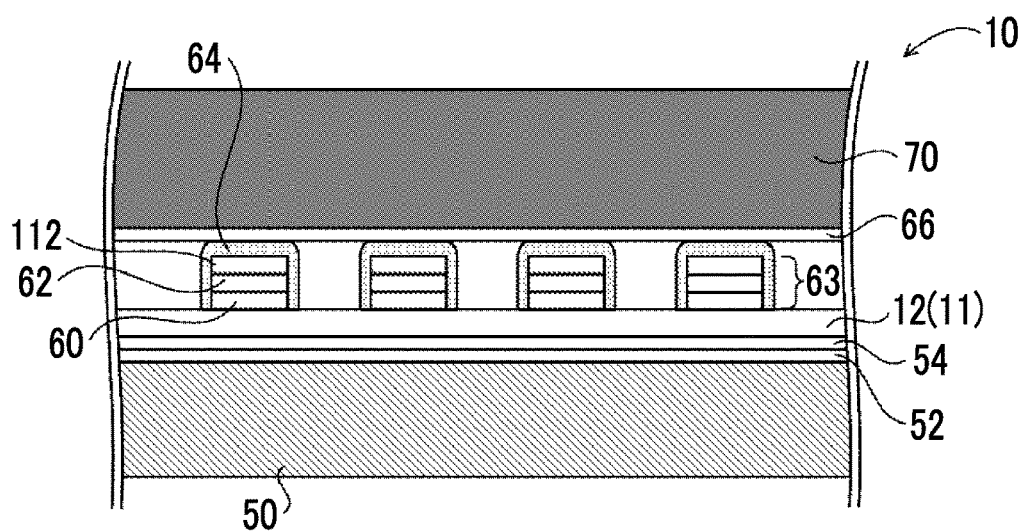
FIG. 3B is a cross-sectional view taken along line B-B of the radiation detector illustrated in FIG. 2.

Moreover, the radiographic imaging apparatus 1 will be described in detail. FIG. 2 is an example of a plan view of the radiation detector 10 according to the present embodiment as seen from the first surface 11A side of the base material 11. Additionally, FIG. 3A is an example of a cross-sectional view taken along line A-A of the radiation detector 10 in FIG. 2. Moreover, FIG. 3B is an example of a cross-sectional view taken along line B-B of the radiation detector 10 in FIG. 2.

The first surface 11A of the base material 11 is divided into a terminal region 60A in which a terminal portion 60 is provided and a terminal region outside 60B in which the terminal portion 60 is not provided. The pixel region 35 provided with the above-described pixel 30 is provided in the terminal region outside 60B.

The base material 11 is a resin sheet that has flexibility and includes, for example, a plastic such as a polyimide (PI). The thickness of the base material 11 may be a thickness such that desired flexibility is obtained in response to the hardness of a material, the size of the sensor substrate 12 (the area of the first surface 11A or a second surface 11B), and the like. In the case of a rectangular base material 11 alone, an example having flexibility indicates one in which the base material 11 hangs down (becomes lower than the height of the fixed side) 2 mm or more due to the gravity of the base material 11 resulting from its own weight at a position 10 cm away from the fixed side with one side of the base material 11 fixed. As a specific example in a case where the base material 11 is the resin sheet, the thickness thereof may be 5 μm to 125 μm, and the thickness thereof may be more preferably 20 μm to 50 μm.

In addition, the base material 11 has characteristics capable of withstanding the manufacture of the pixels 30 and has characteristics capable of withstanding the manufacture of amorphous silicon TFT (a-Si TFT) in the present embodiment. As such a characteristic of the base material 11, it is preferable that the coefficient of thermal expansion (CTE) at 300° C. to 400° C. is about the same as that of amorphous silicon (Si) wafer (for example, ±5 ppm/K), specifically, the coefficient of thermal expansion is preferably 20 ppm/K or less. Additionally, as the heat shrinkage percentage of the base material 11, it is preferable that the heat shrinkage percentage at 400° C. is 0.5% or less with the thickness being 25 μm. Additionally, it is preferable that the elastic modulus of the base material 11 does not have a transition point that general PI has, in a temperature range of 300° C. to 400° C., and the elastic modulus at 500° C. is 1 GPa or more.

Additionally, it is preferable that the base material 11 of the present embodiment has a fine particle layer containing inorganic fine particles having an average particle diameter of 0.05 μm or more and 2.5 μm or less, which absorbs backscattered rays by itself in order to suppress backscattered rays. In addition, as the inorganic fine particles, in the case of the resinous base material 11, it is preferable to use an inorganic substance of which the atomic number is larger than the atoms constituting the organic substance that is the base material 11 and is 30 or less. Specific examples of such fine particles include $SiO_2$ that is an oxide of Si having an atomic number of 14, MgO that is an oxide of Mg having an atomic number of 12, $Al_2O_3$ that is an oxide of Al having an atomic number of 13, $TiO_2$ that is an oxide of Ti having an atomic number of 22, and the like. A specific example of the resin sheet having such characteristics is XENOMAX (registered trademark).

In addition, the above thicknesses in the present embodiment were measured using a micrometer. The coefficient of thermal expansion was measured according to JIS K7197: 1991. In addition, the measurement was performed by cutting out test pieces from a main surface of the base material 11 while changing the angle by 15 degrees, measuring the coefficient of thermal expansion of each of the cut-out test pieces, and setting the highest value as the coefficient of thermal expansion of the base material 11. The coefficient of thermal expansion is measured at intervals of 10° C. between −50° C. and 450° C. in a machine direction (MD) and a transverse direction (TD), and (ppm/° C.) is converted to (ppm/K). For the measurement of the coefficient of thermal expansion, the TMA4000S apparatus made by MAC Science Co., Ltd. is used, sample length is 10 mm, sample width is 2 mm, initial load is 34.5 $g/mm^2$, temperature rising rate is 5° C./min, and the atmosphere is in argon.

The base material 11 having desired flexibility is not limited to a resinous material such as the resin sheet. For example, the base material 11 may be a glass substrate or the like having a relatively small thickness. As a specific example of a case where the base material 11 is the glass substrate, generally, in a size of about 43 cm on a side, the glass substrate has flexibility as long as the thickness is 0.3 mm or less. Therefore, any desired glass substrate may be used as long as the thickness is 0.3 mm or less.

As shown in FIGS. 2 and 3A, the plurality of pixels 30 are provided in a partial region inside the terminal region outside 60B on the first surface 11A of the base material 11. Additionally, in the sensor substrate 12 of the present embodiment, the pixels 30 are not provided in the terminal region 60A on the first surface 11A of the base material 11. In the present embodiment, a region on the first surface 11A of the base material 11 where the pixels 30 are provided is the pixel region 35.

Additionally, as shown in FIGS. 2 and 3A, the conversion layer 14 of the present embodiment covers the pixel region 35. In the present embodiment, a scintillator including CsI (cesium iodide) is used as an example of the conversion layer 14. It is preferable that such a scintillator includes, for example, CsI:Tl (cesium iodide to which thallium is added) or CsI:Na (cesium iodide to which sodium is added) having an emission spectrum of 400 nm to 700 nm at the time of X-ray radiation. In addition, the emission peak wavelength in a visible light region of CsI:Tl is 565 nm.

As shown in FIG. 3A, a pressure-sensitive adhesive layer 40, a, reflective layer 42, an adhesive layer 44, and a protective layer 46 are provided on the conversion layer 14 of the present embodiment.

The pressure-sensitive adhesive layer 40 covers the entire surface of the conversion layer 14. The pressure-sensitive adhesive layer 40 has a function of fixing the reflective layer 42 to the conversion layer 14. The pressure-sensitive adhesive layer 40 preferably has optical transmittance. As materials of the pressure-sensitive adhesive layer 40, for example, an acrylic pressure sensitive adhesive, a hot-melt pressure sensitive adhesive, and a silicone adhesive can be used. Examples of the acrylic pressure sensitive adhesive include urethane acrylate, acrylic resin acrylate, epoxy acrylate, and the like. Examples of the hot-melt pressure sensitive adhesive include thermoplastics, such as ethylene-vinyl acetate copolymer resin (EVA), ethylene-acrylate copolymer resin (EAA), ethylene-ethyl acrylate copolymer resin (EEA), and ethylene-methyl methacrylate copolymer (EMMA). The thickness of the pressure-sensitive adhesive layer 40 is preferably 2 μm or more and 7 μm or less. By setting the thickness of the pressure-sensitive adhesive layer 40 to 2 μm or more, the effect of fixing the reflective layer 42 on the conversion layer 14 can be sufficiently exhibited. Moreover, the risk of forming an air layer between the conversion layer 14 and the reflective layer 42 can be suppressed. When an air layer is formed between the conversion layer 14 and the reflective layer 42, there is a concern that multiple reflections may be caused in which the light emitted from the conversion layer 14 repeats reflections between the air layer and the conversion layer 14 and between the air layer and the reflective layer 42. Additionally, by setting the thickness of the pressure-sensitive adhesive layer 40 to 7 μm or less, it is possible to suppress a decrease in modulation transfer function (MTF) and detective quantum efficiency (DQE).

The reflective layer 42 covers the entire surface of the pressure-sensitive adhesive layer 40. The reflective layer 42 has a function of reflecting the light converted by the conversion layer 14. The reflective layer 42 is preferably made of an organic material. As the material of the reflective layer 42, for example, white PET (Polyethylene terephthalate), $TiO_2$, $Al_2O_3$, foamed white PET, polyester-based high-reflection sheet, specular reflection aluminum, and the like can be used. White PET is obtained by adding a white pigment such as $TiO_2$ or barium sulfate to PET, and foamed white PET is white PET having a porous surface. Additionally, the polyester-based high-reflection sheet is a sheet (film) having a multilayer structure in which a plurality of thin polyester sheets are laminated. The thickness of the reflective layer 42 is preferably 10 μm or more and 40 μm or less.

The adhesive layer 44 covers the entire surface of the reflective layer 42. The end portion of the adhesive layer 44 extends to the surface of the sensor substrate 12. That is, the adhesive layer 44 adheres to the sensor substrate 12 at the end portion thereof. The adhesive layer 44 has a function of fixing the reflective layer 42 and the protective layer 46 to the conversion layer 14. As the material of the adhesive layer 44, the same material as the material of the pressure-sensitive adhesive layer 40 can be used, but the adhesive force of the adhesive layer 44 is preferably larger than the adhesive force of the pressure-sensitive adhesive layer 40.

The protective layer 46 is provided so as to cover the entire conversion layer 14 and covers a part of the sensor substrate 12 at the end portion thereof. The protective layer 46 functions as a moistureproof film that prevents moisture from entering the conversion layer 14. As the material of the protective layer 46, for example, organic films containing organic materials such as PET, polyphenylene sulfide (PPS), oriented polypropylene (OPP: biaxially oriented polypropylene film), polyethylene naphthalate (PEN), and PI, and Parylene (registered trademark) can be used. Additionally, as the protective layer 46, a laminated film of a resin film and a metal film may be used. Examples of the laminated film of the resin film and the metal film include ALPET (registered trademark) sheets.

Additionally, as shown in FIGS. 3A and 3B, a reinforcing member 50 is provided on the second surface 11B side of the base material 11 via an antistatic layer 54 and a pressure sensitive adhesive 52 in the sensor substrate 12 of the radiation detector 10 of the present embodiment.

The reinforcing member 50 has a function of reinforcing the strength of the base material 11. The reinforcing member 50 of the present embodiment is higher in bending stiffness than the base material 11, and the dimensional change (deformation) thereof with respect to a force applied in a direction perpendicular to the surface opposite to the conversion layer 14 is smaller than the dimensional change thereof with respect to a force applied in the direction perpendicular to the second surface 11B of the base material 11. Specifically, the bending stiffness of the reinforcing member 50 is preferably 100 times or more the bending stiffness of the base material 11. Additionally, the thickness of the reinforcing member 50 of the present embodiment is larger than the thickness of the base material 11. For example, in a case where XENOMAX (registered trademark) is used as the base material 11, the thickness of the reinforcing member 50 is preferably about 0.2 mm to 0.25 mm.

Specifically, a material having a bending elastic modulus of 150 MPa or more and 2,500 MPa or less is preferably used for the reinforcing member 50 of the present embodiment. From the viewpoint of suppressing the deflection of the base material 11, the reinforcing member 50 preferably has a higher bending stiffness than the base material 11. In addition, in a case where the bending elastic modulus becomes low, the bending stiffness also becomes low. In order to obtain a desired bending stiffness, the thickness of the reinforcing member 50 should be made large, and the thickness of the entire radiation detector 10 increases. Considering the above-described material of the reinforcing member 50, the thickness of the reinforcing member 50 tends to be relatively large in a case where a bending stiffness exceeding 140,000 Pacm$^4$ is to be obtained. For that reason, in view of obtaining appropriate stiffness and considering the thickness of the entire radiation detector 10, the material used for the reinforcing member 50 preferably has a bending elastic modulus of 150 MPa or more and 2,500 MPa or less. Additionally, the bending stiffness of the reinforcing member 50 is preferably 540 Pacm$^4$ or more and 140,000 Pacm$^4$ or less.

Additionally, the coefficient of thermal expansion of the reinforcing member 50 of the present embodiment is preferably closer to the coefficient of thermal expansion of the material of the conversion layer 14, and the ratio of the coefficient of thermal expansion of the reinforcing member 50 to the coefficient of thermal expansion of the conversion layer 14 (the coefficient of thermal expansion of the reinforcing member 50/the coefficient of thermal expansion of the conversion layer 14) is more preferably 0.5 or more and 2 or less. The coefficient of thermal expansion of such a reinforcing member 50 is preferably 30 ppm/K or more and 80 ppm/K or less. For example, in a case where the conversion layer 14 has CsI:Tl as a material, the coefficient of thermal expansion is 50 ppm/K. In this case, examples of materials relatively close to the conversion layer 14 include polyvinyl chloride (PVC) having a coefficient of thermal expansion of 60 ppm/K to 80 ppm/K, acrylic having a coefficient of thermal expansion of 70 ppm/K to 80 ppm/K, PET having a coefficient of thermal expansion of 65 ppm/K to 70 ppm/K, polycarbonate (PC) having a coefficient of thermal expansion of 65 ppm/K, Teflon (registered trademark) having a coefficient of thermal expansion of 45 ppm/K to 70 ppm/K, and the like. Moreover, considering the above-described bending elastic modulus, the material of the reinforcing member 50 is more preferably a material containing at least one of PET or PC.

From the viewpoint of elasticity, the reinforcing member 50 preferably contains a material having a yield point. In addition, in the present embodiment, the "yield point" means a phenomenon in which the stress rapidly decreases once in a case where the material is pulled, means that the strain is increased without increasing the stress on a curve representing a relationship between the stress and the strain, and indicates the peak of a stress-strain curve in a case where a tensile strength test is performed on the material. Resins having the yield point generally include resins that are hard and strongly sticky, and resins that are soft and strongly sticky and have medium strength. Examples of the hard and strongly sticky resins include PC and the like. Additionally, examples of the resins that are soft and strongly sticky and have medium strength include polypropylene and the like.

The reinforcing member 50 of the present embodiment is a substrate having plastic as a material. In a case where the plastic used as the material for the reinforcing member 50 is preferably a thermoplastic resin for the above-described reasons, and include at least one of PC, PET, styrol, acrylic, polyacetase, nylon, polypropylene, acrylonitrile butadiene styrene (ABS), engineering plastics, or polyphenylene ether. In addition, the reinforcing member 50 is more preferably at least one of polypropylene, ABS, engineering plastics, PET, or polyphenylene ether among these, is more preferably at least one of styrol, acrylics, polyacetase, or nylon, and is even more preferably at least one of PC or PET.

Meanwhile, a plurality of the terminal portions 60 (16 in total in the present embodiment) are provided in the terminal region 60A of the radiation detector 10 of the present embodiment. As shown in FIG. 2, the terminal region 60A is provided on each of two intersecting sides of the rectangular sensor substrate 12 (base material 11). In addition, the terminal region 60A refers to a region on the first surface 11A of the base material 11 where the plurality of terminal portions 60 are provided, and includes at least a region where the terminal portions 60 are in contact with the first surface 11A. As an example, in the present embodiment, a terminal region 60A including at least the region where the terminal portions 60 are in contact with the first surface 11A over the entire side of the sensor substrate 12 (base material 11) where the terminal portions 60 are provided.

As shown in FIG. 2, a cable 112 is electrically connected to each of the terminal portions 60 provided in the terminal region 60A of the base material 11. Specifically, as shown in FIG. 2, the cable 112A is thermocompression-bonded to each of the plurality of (eight in FIG. 2) terminal portions 60 provided on one side of the base material 11. The cable 112A is a so-called chip on film (COF), and a driving integrated circuit (IC) 210 is mounted on the cable 112A. The driving IC 210 is connected to a plurality of signal lines (refer to signal lines 113 in FIG. 4) included in the cable 112A. In addition, in the present embodiment, the cable 112A and the cable 112B to be described below are simply referred to as "cable 112" in a case where the cables are collectively referred to without distinction.

The other end of the cable 112A opposite to the one end electrically connected to the terminal portion 60 of the sensor substrate 12 is electrically connected to the connection region 202 of the driving substrate 200. As an example, in the present embodiment, the plurality of signal lines (refer to the signal lines 113 in FIG. 4) included in the cable 112A are thermocompression-bonded to the driving substrate 200 and thereby connected to circuits and elements (not shown) mounted on the driving substrate 200. In addition, the method of electrically connecting the driving substrate 200 and the cable 112A is not limited to the present embodiment. For example, a configuration may be adopted in which the driving substrate 200 and the flexible cable 112A are electrically connected by a connector. Examples of such a connector include a zero insertion force (ZIF) structure connector and a Non-ZIF structure connector.

The driving substrate 200 of the present embodiment is a flexible printed circuit board (PCB), which is a so-called flexible substrate. Additionally, circuit components (not shown) mounted on the driving substrate 200 are components mainly used for processing digital signals (hereinafter, referred to as "digital components"). Digital components tend to have a relatively smaller area (size) than analog components to be described below. Specific examples of the digital components include digital buffers, bypass capacitors, pull-up/pull-down resistors, damping resistors, electromagnetic compatibility (EMC) countermeasure chip components, power source ICs, and the like. In addition, the driving substrate 200 may be not necessarily a flexible substrate and may be a non-flexible rigid substrate or a rigid flexible substrate.

In the present embodiment, the driver 102 is realized by the driving substrate 200 and the driving IC 210 mounted on the cable 112A. In addition, the driving IC 210 includes, among various circuits and elements that realize the driver 102, circuits different from the digital components mounted on the driving substrate 200.

Meanwhile, the cable 112B is electrically connected to each of the plurality (8 in FIG. 2) of terminal portions 60 provided on a side intersecting with one side of the base material 11 to which the cable 112A is electrically connected. Similarly the cable 112A, the cable 112B is a so-called chip on film (COF), and a signal processing IC 310 is mounted on the cable 112B. The signal processing IC 310 is connected to a plurality of signal lines (refer to signal lines 113 in FIG. 4) included in the cable 112B.

The other end of the cable 112B opposite to the one end electrically connected to the terminal portion 60 of the sensor substrate 12 is electrically connected to the connection region 302 of the signal processing substrate 300. As an example, in the present embodiment, the plurality of signal lines (refer to the signal lines 113 in FIG. 4A) included in the cable 112A are thermocompression-bonded to the signal processing substrate 300 and thereby connected to circuits and elements (not shown) mounted on the signal processing substrate 300. In addition, the method of electrically connecting the signal processing substrate 300 and the cable 112B is not limited to the present embodiment. For example, a configuration may be adopted in which the signal processing substrate 300 and the cable 112B are electrically connected by a connector. Examples of such a connector include a zero insertion force (ZIF) structure connector and a Non-ZIF structure connector. Additionally, the method of electrically connecting the cable 112A and the driving substrate 200 and the method of electrically connecting the cable 112B and the signal processing substrate 300 may be the same or different. For example, a configuration may be adopted in which the cable 112A and the driving substrate 200 are electrically connected by thermocompression bonding, and the cable 112B and the signal processing substrate 300 are electrically connected by a connector.

The signal processing substrate 300 of the present embodiment is a flexible PCB, which is a so-called flexible substrate, similarly to the above-described driving substrate 200. Circuit components (not shown) mounted on the signal processing substrate 300 are components mainly used for processing analog signals (hereinafter referred to as "analog components"). Specific examples of the analog components include charge amplifiers, analog-to-digital converters (ADCs), digital-to-analog converters (DAC), and power source ICs. Additionally, the circuit components of the present embodiment also include coils around a power source, which has a relatively large component size, and large-capacity smoothing capacitors. In addition, the signal processing substrate 300 may not be necessarily a flexible substrate and may be an non-flexible rigid substrate or a rigid flexible substrate.

In the present embodiment, the signal processor 104 is realized by the signal processing substrate 300 and the signal processing IC 310 mounted on the cable 112B. In addition, the signal processing IC 310 includes, among various circuits and elements that realize the signal processor 104, circuits different from the analog components mounted on the signal processing substrate 300.

In addition, in the present embodiment, an embodiment in which a plurality of (two) the driving substrates 200 and a plurality of (two in FIG. 2) the signal processing substrates 300 are provided has been described. However, the number of driving substrates 200 and the number of signal processing substrates 300 are not limited to the present embodiment. For example, a form may be adopted in which any one of the driving substrate 200 or the signal processing substrate 300 may be a single substrate.

Meanwhile, as shown in FIGS. 3A and 3B, in the radiation detector 10 of the present embodiment, the cable 112 is thermocompression-bonded to the terminal portion 60 via a connection layer 62, and thereby the cable 112 is electrically connected to the terminal portion 60. In addition, although FIGS. 3A and 3B are views showing an example of a structure relating to the electrical connection between the cable 112A and the radiation detector 10, a structure related to the electrical connection between the cable 112B and the radiation detector 10 of the present embodiment is also the same as the form illustrated in FIGS. 3A and 3B.

The connection layer 62 has a function of electrically connecting the terminal portion 60 and the cable 112. Examples of the connection layer 62 include an anisotropic conductive film or the like, and an anisotropic conductive film (ACF) in which conductive particles (refer to conductive particles 62A in FIG. 4A) are dispersed in an adhesive that is cured by heat can be used.

As shown in FIGS. 3A and 3B, the first surface 11A side of the base material 11 in the laminate 63 in which the terminal portion 60, the connection layer 62, and the cable 112 are laminated is covered with the strengthening member 64. Additionally, a side surface of the laminate in which the terminal portion 60, the connection layer 62, and the cable 112 are laminated and a side surface of the base material 11 are covered with the strengthening member 65. The strengthening member 64 and the strengthening member 65 have a function of strengthening the electrical connection between the terminal portion 60 and the cable 112. Additionally, the strengthening member 64 and the strengthening member 65 of the present embodiment have moistureproofness. As the strengthening member 64 and the strengthening member 65, for example, a moistureproof insulating film can be used, and Tuffy (registered trademark) or the like, which is a moistureproof insulating material for flat panel display (FPD), can be used. In addition, each of the strengthening member 64 and the strengthening member 65 may be a member made of the same material or a member made of a different material.

Moreover, as shown in FIGS. 3A and 3B, a stress neutral plane adjusting member 70 is provided on the laminate 63 covered with the strengthening member 64 via a pressure sensitive adhesive 66. The stress neutral plane adjusting member 70 adjusts the position, with respect to a lamination direction P, of the laminate 63, of a stress neutral plane 71 (refer to FIG. 5, the details will be described below) in the region where the laminate 63 of the radiation detector 10 is provided in a case where when the radiation detector 10 is deflected. In the present embodiment, as an example of the stress neutral plane adjusting member 70, PET is used and white PET, foamed white PET, or the like may be used. Additionally, other examples of the stress neutral plane adjusting member 70 include organic films such as PC, low density polyethylene (LDPE), PPS, OPP, PEN, and PI.

Additionally, a material having a bending elastic modulus of 150 MPa or more and 2,500 MPa or less is preferably used for the stress neutral plane adjusting member 70 of the present embodiment. A method of measuring the bending elastic modulus is based on, for example, JIS K 7171:2016 Standard. From the viewpoint of suppressing the deflection of the base material 11, the stress neutral plane adjusting member 70 preferably has a higher bending stiffness than the base material 11. In addition, the bending stiffness referred to here means the difficulty of bending and that the higher the bending stiffness, the more difficult it is to bend. In a case where the bending elastic modulus becomes low, the bending stiffness also becomes low. In order to obtain a desired bending stiffness, the thickness of the stress neutral plane adjusting member 70 should be made large, and the thickness of the entire radiation detector 10 increases. Considering the material of the above-described stress neutral plane adjusting member 70, the thickness of the stress neutral plane adjusting member 70 tends to be relatively large in a case where a bending stiffness exceeding 140,000 Pacm$^4$ is to be obtained. For that reason, in view of obtaining appropriate stiffness and considering the thickness of the entire radiation detector 10, the material used for the stress neutral plane adjusting member 70 preferably has a bending elastic modulus of 150 MPa or more and 2,500 MPa or less. Additionally, the bending stiffness of the stress neutral plane adjusting member 70 is preferably 540 Pacm$^4$ or more and 140,000 Pacm$^4$ or less.

Additionally, the coefficient of thermal expansion of the stress neutral plane adjusting member 70 of the present embodiment is preferably closer to the coefficient of thermal expansion of the material of the conversion layer 14, and the ratio of the coefficient of thermal expansion of the stress neutral plane adjusting member 70 to the coefficient of thermal expansion of the conversion layer 14 (the coefficient of thermal expansion of the stress neutral plane adjusting member 70/the coefficient of thermal expansion of the conversion layer 14) is more preferably 0.5 or more and 4 or less. The coefficient of thermal expansion of such a stress neutral plane adjusting member 70 is preferably 30 ppm/K or more and 200 ppm/K or less. For example, in a case where the conversion layer 14 has CsI:Tl as a material, the coefficient of thermal expansion is 50 ppm/K. In this case, materials for the stress neutral plane adjusting member 70 include LDPE having a coefficient of thermal expansion of 100 ppm/K to 200 ppm/K, PVC having a coefficient of thermal expansion of 60 ppm/K to 80 ppm/K, acrylic having a coefficient of thermal expansion of 70 ppm/K to 80 ppm/K, PET having a coefficient of thermal expansion of 65 ppm/K to 70 ppm/K, a PC having a coefficient of thermal expansion of 65 ppm/K, and Teflon (registered trademark) having a coefficient of thermal expansion of 45 ppm/K to 70 ppm/K.

Moreover, considering the above-described bending elastic modulus, the material of the stress neutral plane adjusting member 70 is more preferably a material containing at least one of PET, PC, or LDPE.

In addition, the stress neutral plane adjusting member 70 preferably has other functions such as an antistatic function and a moistureproof function in addition to the function of adjusting the position of the stress neutral plane.

The operation of the stress neutral plane adjusting member 70 in the radiation detector 10 of the present embodiment will be described with reference to FIGS. 4A, 4B, and 5. In addition, in FIGS. 4A, 4B, and 5, for simplification, only the configuration of the radiation detector 10 required for explaining the operation of the stress neutral plane adjusting member 70 is schematically shown.

Figure 4A:
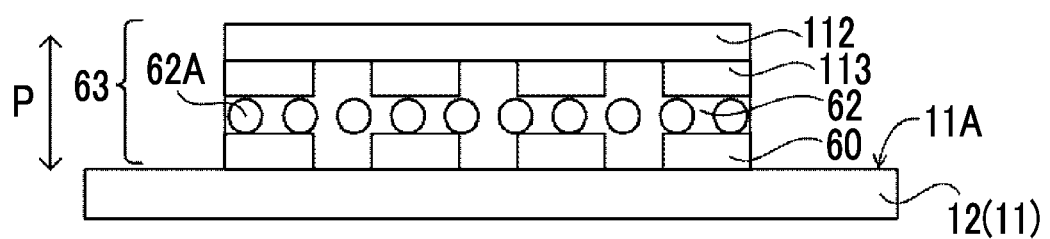
FIG. 4A is a schematic view for explaining the operation of a stress neutral plane adjusting member.

As shown in FIG. 4A, the connection layer 62 contains the conductive particles 62A. By disposing the conductive particles 62A between the terminal portion 60 provided on the first surface 11A of the base material 11 and the signal line 113, the terminal portion 60 and the signal line 113 of the cable 112 are electrically connected to each other.

Figure 4B:
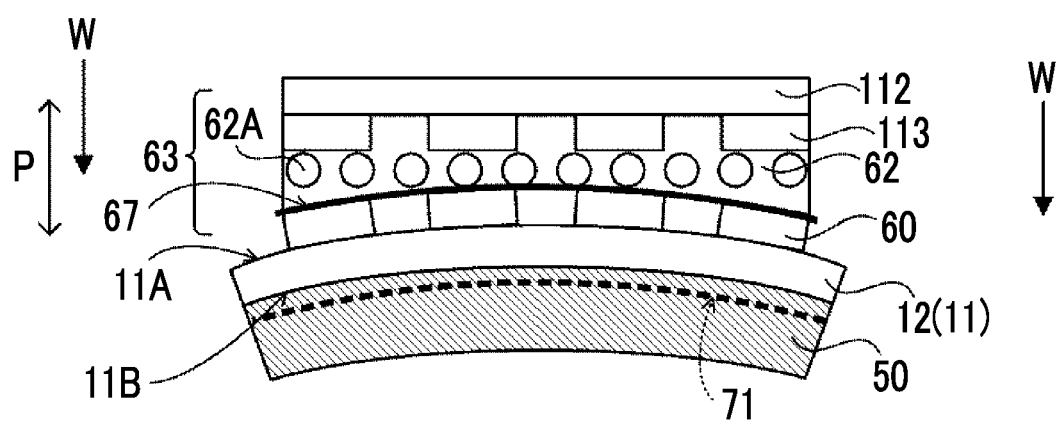
FIG. 4B is a schematic view for explaining the operation of the stress neutral plane adjusting member.

FIG. 4B shows a state in which the stress neutral plane adjusting member 70 of the present embodiment is not provided. As shown in FIG. 4B, with the reinforcing member 50 provided on the second surface 11B of the sensor substrate 12 (base material 11), for example, in a case where a load W is applied in the lamination direction of the laminate 63, or in a case where a film stress is applied, the sensor substrate 12 and the reinforcing member 50 are deflected. In a state in which the reinforcing member 50 is provided and the stress neutral plane adjusting member 70 is not provided, the position of the stress neutral plane 71 generated in a case where the sensor substrate 12 and the reinforcing member 50 are deflected in the lamination direction is a position closer to the reinforcing member 50 side than the interface 67 where the terminal portion 60 and the conductive particles 62A of the connection layer 62 are in contact with each other. The example shown in FIG. 4B shows a state in which the stress neutral plane 71 is located in the reinforcing member 50. In addition, the "stress neutral plane 71" refers to a plane in which the sensor substrate 12 and the reinforcing member 50 do not expand or contract even when bent, in other words, a plane in a direction intersecting the lamination direction P. In the stress neutral plane 71, the stress becomes zero.

In the example shown in FIG. 4B, since the position of the stress neutral plane 71 is a position relatively far from the interface 67, the terminal portion 60 is also deflected in response to the deflection of the sensor substrate 12 and the reinforcing member 50. Specifically, the interface 67 is deflected. For that reason, as shown in FIG. 4B, the terminal portion 60 and the conductive particles 62A are in a non-contact state, and the electrical connection between the terminal portion 60 and the cable 112 is disconnected. In a case where the electrical connection between the terminal portion 60 and the cable 112 is disconnected, there is a case where the image quality of a radiographic image obtained by the radiation detector 10 degrades, and for example, there is a case where so-called line defects occur.

On the other hand, in the radiation detector 10 of the present embodiment, since the stress neutral plane adjusting member 70 is provided on the laminate 63, the position of the stress neutral plane 71 moves to the laminate 63 side compared to a case where the stress neutral plane adjusting member 70 is not provided.

Figure 5:
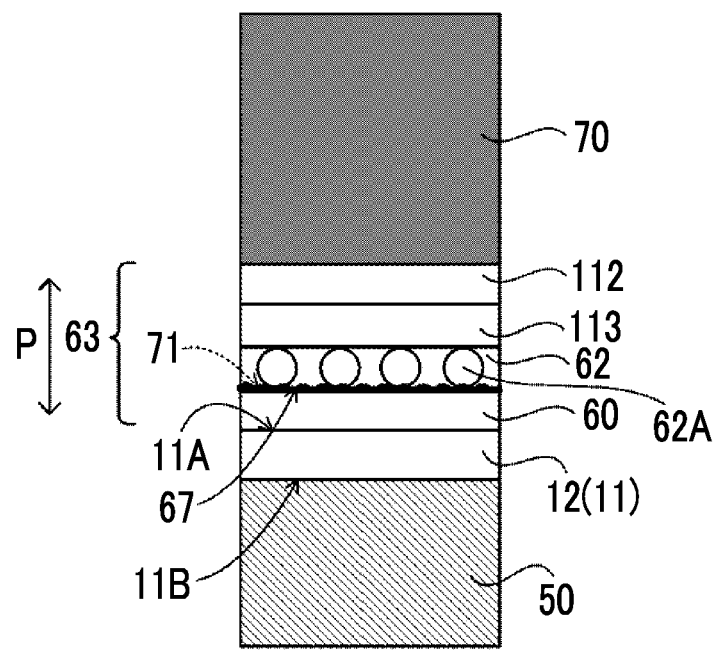
FIG. 5 is a schematic view for explaining the operation of the stress neutral plane adjusting member.

As shown in FIG. 5, in a case where the stress neutral plane adjusting member 70 is provided, the distance between the stress neutral plane 71 and the interface 67 can be made to be smaller than that in a case where the stress neutral plane adjusting member 70 is not provided (in the case of FIG. 4B). In other words, in a case where the stress neutral plane adjusting member 70 is provided, the distance between the position of the stress neutral plane 71 and the position of the interface 67 can be made to be smaller than that in a case where the stress neutral plane adjusting member 70 is not provided (in the case of FIG. 4B). By moving the position of the stress neutral plane 71 closer to the position of the interface 67, the stress on the interface 67 in a case where the sensor substrate 12 and the reinforcing member 50 are deflected can be reduced. Therefore, the terminal portion 60 and the conductive particles 62A of the connection layer 62 are less likely to be in a non-contact state. Therefore, the electrical connection between the terminal portion 60 and the cable 112 is less likely to be disconnected.

In addition, the position of the stress neutral plane 71 is preferably a position in the laminate 63. Regarding the position of the stress neutral plane 71, the inside of the laminate 63 in the present embodiment is an example within a predetermined range of the present disclosure.

Additionally, as shown in FIG. 5, it is more preferable that the position of the stress neutral plane 71 and the position of the interface 67 coincide with each other. In this case, even in a case where the sensor substrate 12 and the reinforcing member 50 are deflected, the stress on the interface 67 can be set to 0. Therefore, the terminal portion 60 and the conductive particles 62A of the connection layer 62 are less likely to be in a non-contact state. Therefore, the electrical connection between the terminal portion 60 and the cable 112 is less likely to be disconnected.

In this way, in the radiation detector 10 of the present embodiment, by providing the stress neutral plane adjusting member 70 on the laminate 63 where the terminal portion 60, the connection layer 62, and the cable 112 are laminated, on the first surface 11A of the sensor substrate 12 (base material 11), the position of the stress neutral plane 71 in the lamination direction P can be adjusted in the vicinity of the interface 67. Accordingly, in the radiation detector 10 of the present embodiment, in a case where the sensor substrate 12 and the reinforcing member 50 are deflected, the stress generated on the interface 67 can be brought close to 0. Therefore, the electrical connection between the terminal portion 60 and the cable 112 is less likely to be disconnected.

In addition, the thickness of the stress neutral plane adjusting member 70 is determined in response to a range that can be allowed as the position of the stress neutral plane 71 from the interface 67. As an allowable range, for example, the inside of the laminate 63 can be mentioned as described above. The specific thickness of the stress neutral plane adjusting member 70 is determined in response to the ease with which the conductive particles 62A of the connection layer 62 and the terminal portion 60 are brought into a non-contact state, the degree of expected deflection, and the like. For example, it is preferable that the thicker the reinforcing member 50 is, the thicker the stress neutral plane adjusting member 70 is.

An example of the method of manufacturing the radiation detector 10 of the present embodiment will be described with reference to FIGS. 6A and 6E.

Meanwhile, as shown in FIG. 6A, the base material 11 is formed on a support body 400, such as a glass substrate which is thicker than the base material 11, via a peeling layer 402. For example, in a case where the base material 11 is formed by a lamination method, a sheet to be the base material 11 is bonded onto the support body 400. The second surface 11B of the base material 11 is in contact with the peeling layer 402. In addition, the method of forming the base material 11 is not limited to the present embodiment. For example, a form may be adopted in which the base material 11 is formed by an application method.

Moreover, the pixels 30 are formed on the terminal region outside 60B on the first surface 11A of the base material 11. In addition, in the present embodiment, as an example, the pixels 30 are formed on the first surface 11A of the base material 11 via an undercoat layer (not shown) made of SiN or the like.

Moreover, the conversion layer 14 is formed on a layer on which the pixels 30 are formed (hereinafter, simply referred to as "pixels 30"). In the present embodiment, the conversion layer 14 of CsI is directly formed as a columnar crystal on the sensor substrate 12 by vapor-phase deposition methods, such as a vacuum vapor deposition method, a sputtering method, and a chemical vapor deposition (CVD) method. In this case, the side of the conversion layer 14 in contact with the pixels 30 is a growth-direction base point side of the columnar crystal.

In addition, in a case where a CsI scintillator is used as the conversion layer 14, the conversion layer 14 can be formed on the sensor substrate 12 by a method different from the method of the present embodiment. For example, the conversion layer 14 may be formed on the sensor substrate 12 by preparing one in which CsI is vapor-deposited on an aluminum plate or the like by a vapor-phase deposition method and bonding a side of the CsI, which is not in contact with the aluminum plate, and the pixels 30 of the sensor substrate 12 to each other with a pressure sensitive adhesive sheet or the like. In this case, it is preferable that one in which the entire conversion layer 14 also including an aluminum plate is covered with the protective layer 46 is bonded to the pixels 30 of the sensor substrate 12. In addition, in this case, the side of the pixels 30 in contact with the conversion layer 14 is a distal end side in the growth direction of the columnar crystal.

Additionally, unlike the radiation detector 10 of the present embodiment, GOS ($Gd_2O_2S$:Tb)) or the like may be used as the conversion layer 14 instead of CsI. In this case, for example, the conversion layer 14 can be formed on the sensor substrate 12 by preparing one in which a sheet having GOS dispersed in a binder such as resin is bonded to a support body formed of white PET or the like with a pressure-sensitive adhesive layer or the like, and bonding a side of the GOS on which the support body is not bonded, and the pixel 30 of the sensor substrate 12 to each other with the pressure sensitive adhesive sheet or the like. In addition, the conversion efficiency from radiation to visible light is higher in a case where CsI is used for the conversion layer 14 than in a case where GOS is used.

Additionally, the reflective layer 42 is provided on the conversion layer 14 formed on the sensor substrate 12, via the pressure-sensitive adhesive layer 40, and the protective layer 46 is further provided via the adhesive layer 44. Additionally, the terminal portion 60 is formed in the terminal region 60A of the first surface 11A of the base material 11.

Figure 6B:
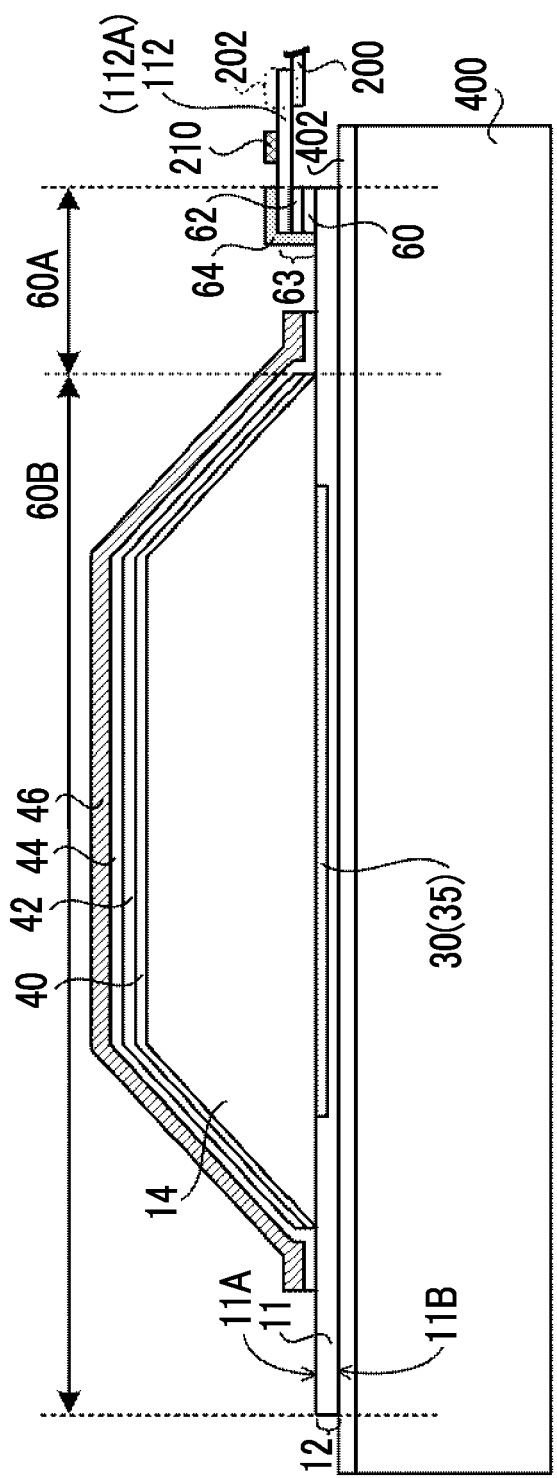
FIG. 6B is a view illustrating the example of the method of manufacturing the radiation detector of the embodiment.

Next, as shown in FIG. 6B, the cable 112 is thermocompression-bonded to the terminal portion 60 via the connection layer 62 to electrically connect the terminal portion 60 and the connection layer 62 to each other. Moreover, the laminate 63 is covered with the strengthening member 64.

Figure 6C:
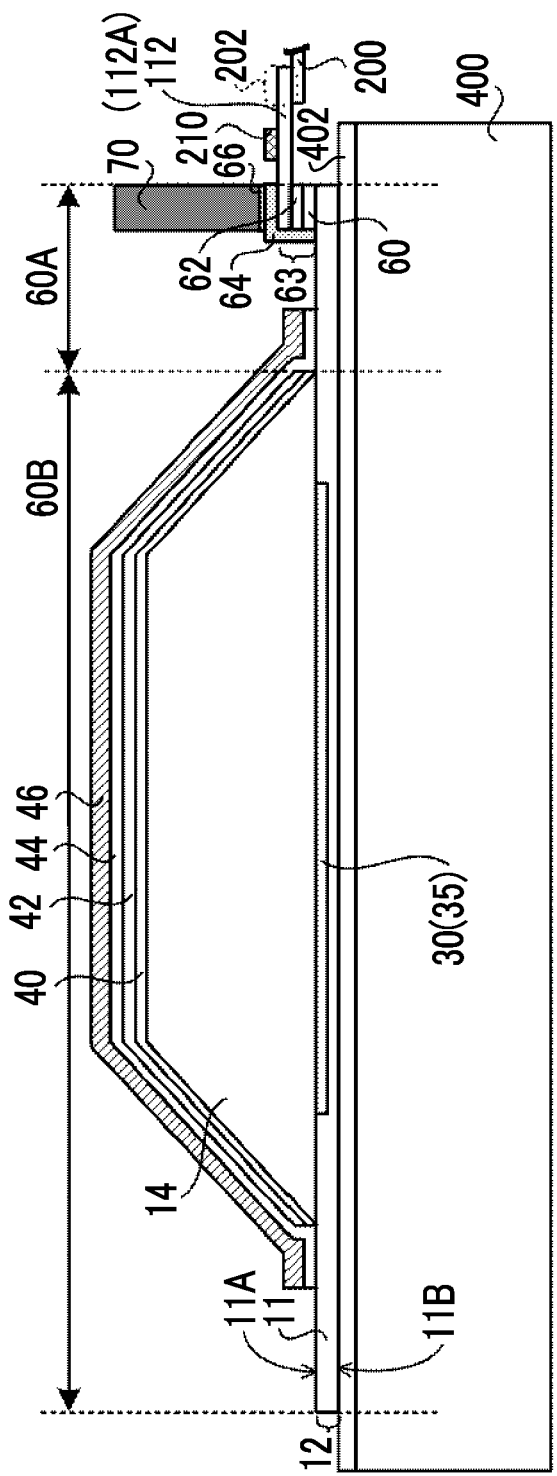
FIG. 6C is a view illustrating the example of the method of manufacturing the radiation detector of the embodiment.

Next, as shown in FIG. 6C, the stress neutral plane adjusting member 70 is provided by the pressure sensitive adhesive 66 on the laminate 63 covered with the strengthening member 64.

Figure 6D:
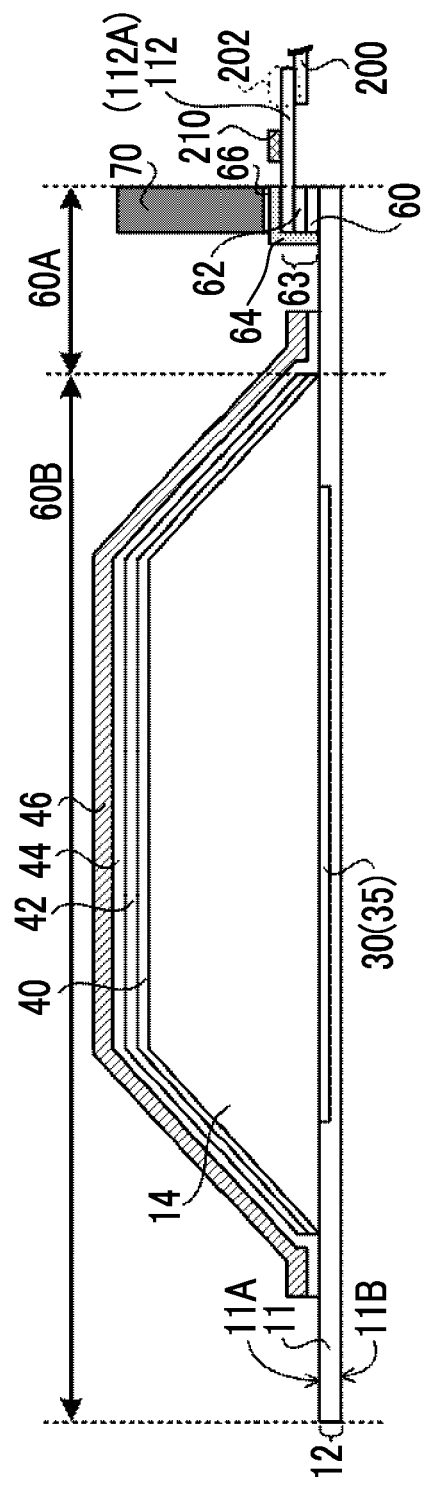
FIG. 6D is a view illustrating the example of the method of manufacturing the radiation detector of the embodiment.

After the stress neutral plane adjusting member 70 is provided, the sensor substrate 12 in a state in which the cable 112 is electrically connected to the conversion layer 14 and the terminal portion 60 is peeled off from the support body 400 and is brought into the state shown in FIG. 6D. For example, in the lamination method, mechanical peeling is performed by using any of the four sides of the sensor substrate 12 (base material 11) as a starting point for peeling, and gradually peeling the sensor substrate 12 off from the support body 400 toward a side facing the side to be the starting point.

Figure 6E:
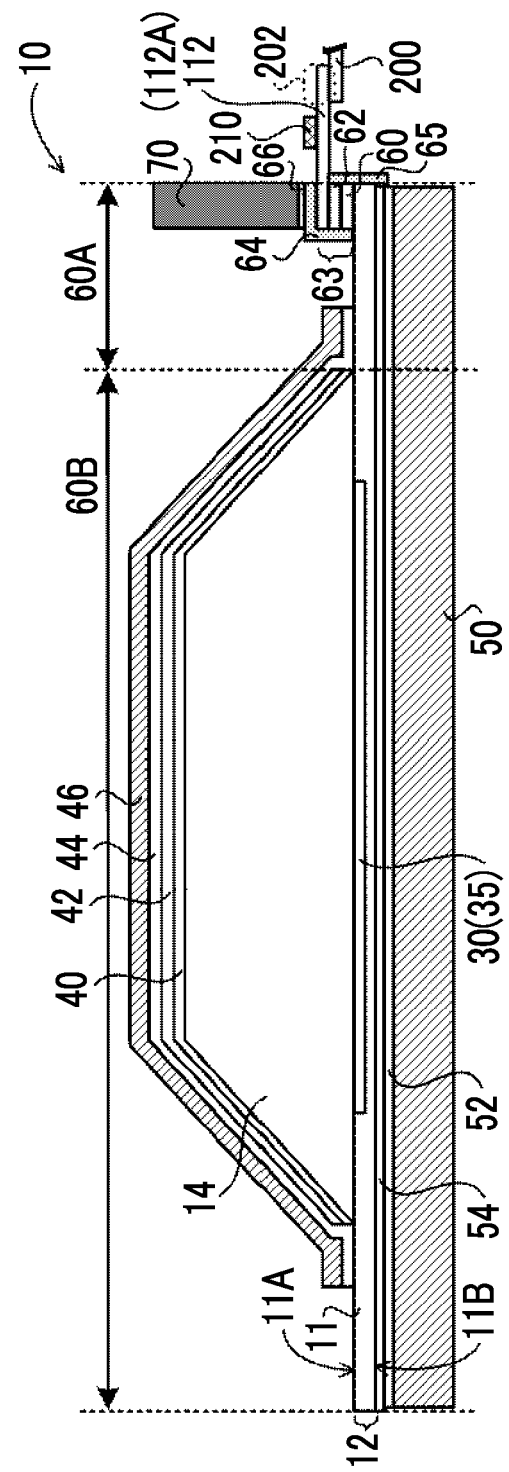
FIG. 6E is a view illustrating the example of the method of manufacturing the radiation detector of the embodiment.

Moreover, after the sensor substrate 12 is peeled off from the support body 400, as shown in FIG. 6E, the reinforcing member 50 is formed on the second surface 11B of the base material 11 via the antistatic layer 54 and the pressure sensitive adhesive 52 by attachment or the like. In this way, the radiation detector 10 of the present embodiment is manufactured.

In addition, the radiation detector 10 of the present embodiment may be in forms shown in the following Modification Examples 1 to 5. In addition, forms may be adopted in which Modification Examples 1 to 5 are appropriately combined together.

Modification Example 1

Figure 7:
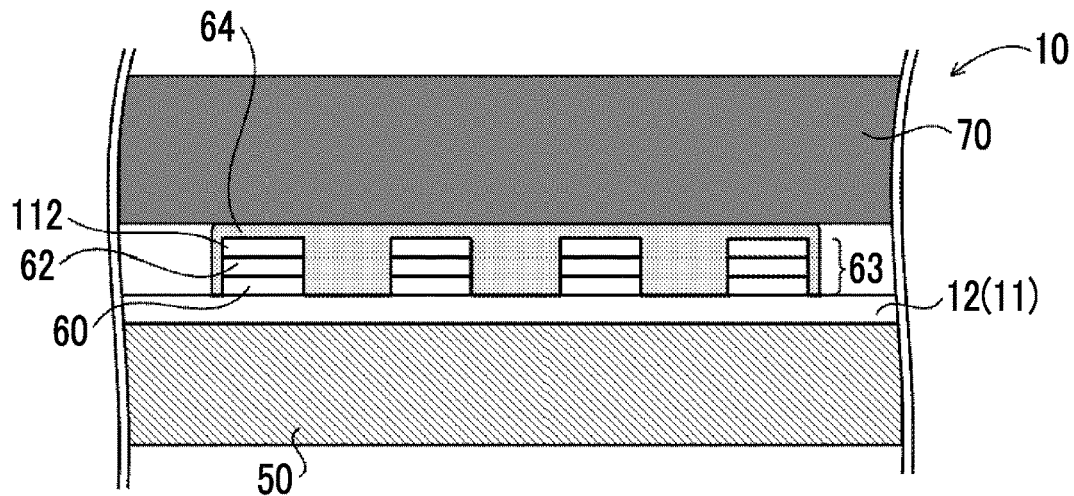
FIG. 7 is a cross-sectional view taken along line B-B of a radiation detector of Modification Example 1.

FIG. 7 shows an example of a cross-sectional view of a radiation detector 10 of the present modification example, which corresponds to the cross-sectional view taken along the line B-B of the radiation detector 10 shown in FIG. 3B. In addition, in FIG. 7, the description of the pressure sensitive adhesive 52, the antistatic layer 54, and the pressure sensitive adhesive 66 is omitted.

In the radiation detector 10 shown in FIG. 3B, the strengthening member 64 covered each laminate 63, in other words, each terminal portion 60. However, as shown in FIG. 7, in the radiation detector 10 of the present modification example, the strengthening member 64 collectively covers all of the plurality of laminates 63. For that reason, a space between the laminates 63 is filled with the strengthening member 64. Therefore, in the radiation detector 10 of the present modification example, the plurality of laminates 63 are integrally fixed to the sensor substrate 12. In addition, the number of laminates 63 that are collectively covered with the strengthening member 64 is not particularly limited. For example, a form may be adopted in which the laminates 63 in which the driving substrate 200 or the signal processing substrate 300 electrically connected by the cable 112 is the same are collectively covered with the strengthening member 64. Additionally, for example, a form may be adopted in which the laminates 63 formed by all the terminal portions 60 provided on one side of the sensor substrate 12 (base material 11) are collectively covered with the strengthening member 64.

Modification Example 2

Figure 8A:
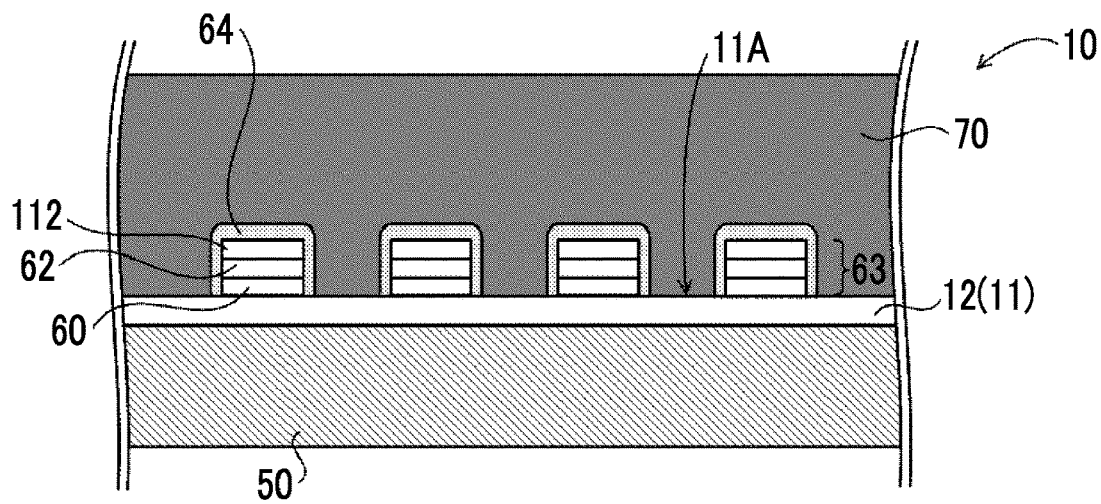
FIG. 8A is a cross-sectional view taken along line B-B of an example of a radiation detector of Modification Example 2.
Figure 8B:
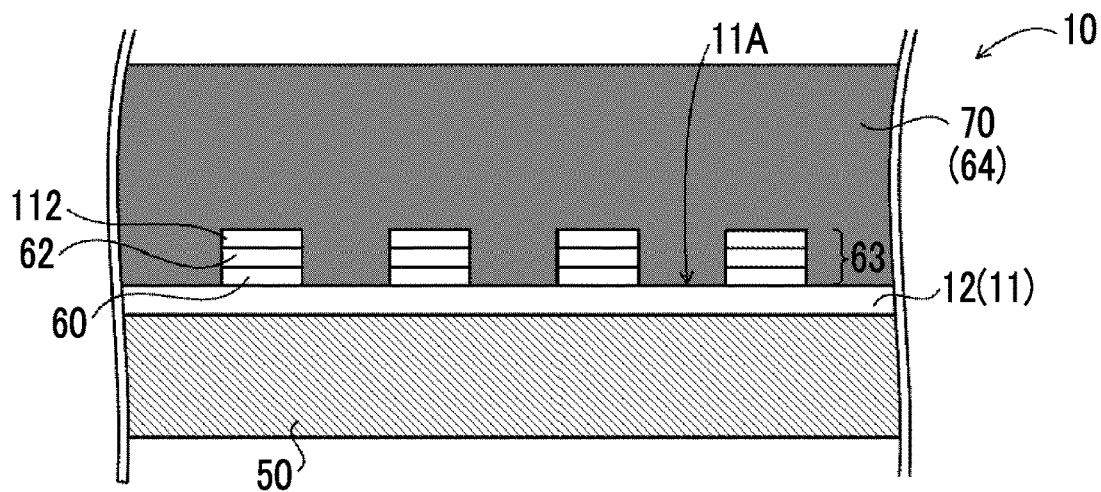
FIG. 8B is a cross-sectional view taken along line B-B of another example of a radiation detector of Modification Example 2.

FIGS. 8A and 8B illustrate an example of a cross-sectional view of a radiation detector 10 of the present modification example, which corresponds to the sectional view taken along the line B-B of the radiation detector 10 shown in FIG. 3B. In addition, in FIGS. 8A and 8B, the description of the pressure sensitive adhesive 52, the antistatic layer 54, and the pressure sensitive adhesive 66 is omitted.

In the radiation detector 10 of the present modification example shown in FIG. 8A, the space between the laminates 63 covered with the strengthening member 64 is filled with the stress neutral plane adjusting member 70, and the stress neutral plane adjusting member 70 reaches the first surface 11A of the sensor substrate 12 (base material 11).

As the space between the laminates 63 is filled with the stress neutral plane adjusting member 70 that reaches the first surface 11A of the base material 11, the electrical connection between the terminal portion 60 and the cable 112 is strengthened by the stress neutral plane adjusting member 70.

In addition, as shown in FIG. 8B, the stress neutral plane adjusting member 70 may collectively cover all of the plurality of laminates 63 without providing the strengthening member 64. In the case of the form shown in FIG. 8B, the stress neutral plane adjusting member 70 is not limited to a member made of the above-described material, and may be a member made of the same material as the strengthening member 64. That is, in the case of the form shown in FIG. 8B, the strengthening member 64 may be used as the stress neutral plane adjusting member 70.

Modification Example 3

Figure 9:
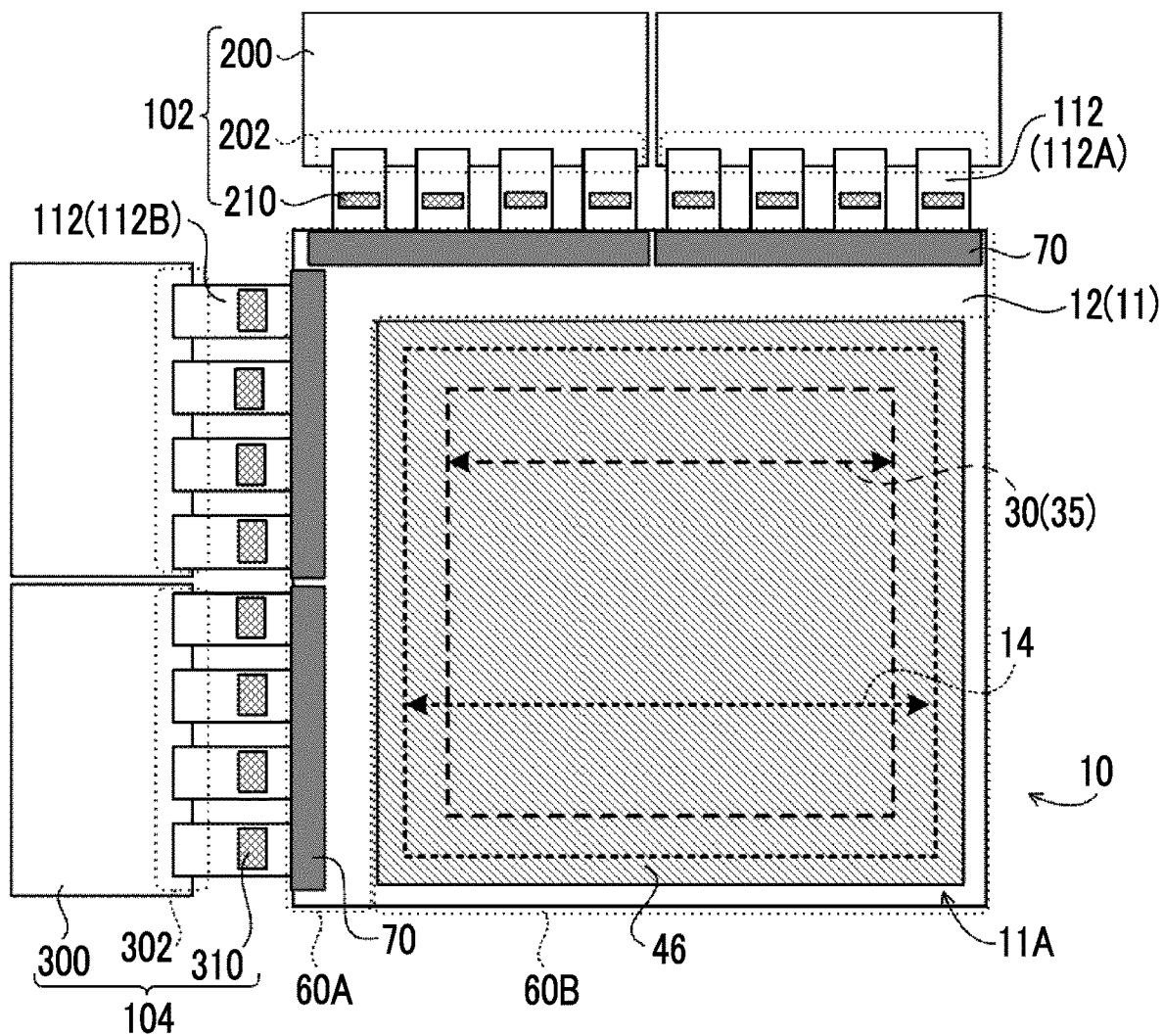
FIG. 9 is a plan view of an example of a radiation detector of Modification Example 3 as seen from a first surface side of a base material.

FIG. 9 shows an example of a plan view of a radiation detector 10 of the present modification example, which corresponds to the plan view taken of the radiation detector 10 illustrated in FIG. 2.

In the radiation detector 10 shown in FIG. 2, the stress neutral plane adjusting member 70 is provided on each side of the sensor substrate 12 (base material 11) corresponding to the terminal region 60A. In other words, in the radiation detector 10 shown in FIG. 2, the stress neutral plane adjusting member 70 is provided on each of the laminate 63 (refer to FIG. 3B and the like) corresponding to the cable 112A and the laminate 63 (refer to FIG. 3B and the like) corresponding to the cable 112B.

However, the stress neutral plane adjusting member 70 may be provided over at least one or more laminates 63 (terminal portions 60), and the number thereof is not limited. For example, in the radiation detector 10 of the present modification example shown in FIG. 9, a state in which two stress neutral plane adjusting members 70 are provided on each of the cable 112A side and the cable 112B side is shown. In addition, the present invention is not limited to the present modification example, and the stress neutral plane adjusting member 70 may be provided for each laminate 63 (terminal portion 60). By providing the stress neutral plane adjusting member 70 over the plurality of laminates 63 (terminal portions 60), it is possible to further suppress the electrical disconnection between the terminal portion 60 and the cable 112. On the other hand, by providing the plurality of stress neutral plane adjusting members 70, the weight of the stress neutral plane adjusting member 70 can be reduced. Therefore, the weight of the entire radiation detector 10 can be reduced.

In this way, the stress neutral plane adjusting member 70 may not be provided in the entire terminal region 60A. Additionally, the stress neutral plane adjusting member 70 may not be provided on the entire upper surface of each laminate 63.

Modification Example 4

Figure 10:
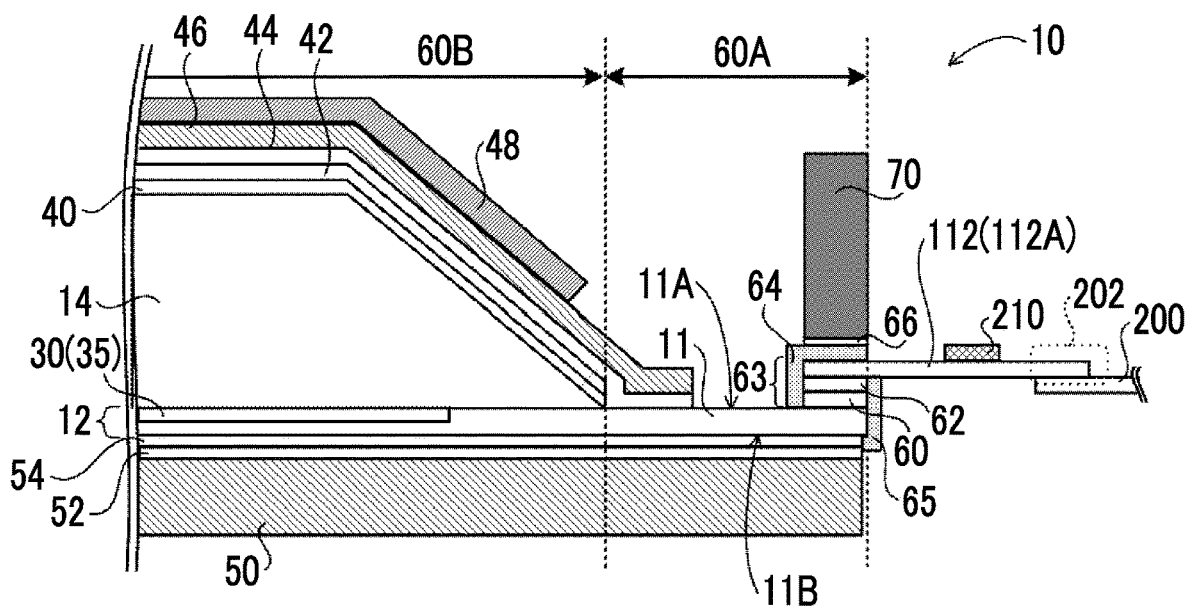
FIG. 10 is a cross-sectional view taken along line A-A of an example of a radiation detector of Modification Example 4.

FIG. 10 shows an example of a cross-sectional view of a radiation detector 10 of the present modification example, which corresponds to the sectional view taken along the line A-A of the radiation detector 10 shown in FIG. 3A.

As shown in FIG. 10, in the radiation detector 10 of the present modification example, a reinforcing layer 48 is further provided on the conversion layer 14 covered with the protective layer 46.

The reinforcing layer 48 has a higher bending stiffness than the base material 11, and a dimensional change (deformation) due to a force applied in a direction perpendicular to the surface facing the conversion layer 14 is smaller than a dimensional change due to a force applied in a direction perpendicular to the first surface 11A of the base material 11. Additionally, the thickness of the reinforcing layer 48 of the present modification example is larger than the thickness of the base material 11.

The characteristics that are preferable as the reinforcing layer 48 are the same as those of the above-described reinforcing layer 48. The reinforcing layer 48 of the present modification example preferably uses a material having a bending elastic modulus of 150 MPa or more and 2,500 MPa or less. From the viewpoint of suppressing the deflection of the base material 11, the reinforcing layer 48 preferably has a higher bending stiffness than the base material 11. In addition, in a case where the bending elastic modulus becomes low, the bending stiffness also becomes low. In order to obtain a desired bending stiffness, the thickness of the reinforcing layer 48 should be made large, and the thickness of the entire radiation detector 10 increases. Considering the material of the reinforcing layer 48, the thickness of the reinforcing layer 48 tends to be relatively large in a case where a bending stiffness exceeding 140,000 Pacm$^4$ is to be obtained. For that reason, in view of obtaining appropriate stiffness and considering the thickness of the entire radiation detector 10, the material used for the reinforcing layer 48 preferably has a bending elastic modulus of 150 MPa or more and 2,500 MPa or less. Additionally, the bending stiffness of the reinforcing layer 48 is preferably 540 Pacm$^4$ or more and 140,000 Pacm$^4$ or less.

Additionally, the coefficient of thermal expansion of the reinforcing layer 48 is preferably closer to the coefficient of thermal expansion of the material of the conversion layer 14, and the ratio of the coefficient of thermal expansion of the reinforcing layer 48 to the coefficient of thermal expansion of the conversion layer 14 (the coefficient of thermal expansion of the reinforcing layer 48/the coefficient of thermal expansion of the conversion layer 14) is more preferably 0.5 or more and 2 or less. The coefficient of thermal expansion of such a reinforcing layer 48 is preferably 30 ppm/K or more and 80 ppm/K or less. For example, in a case where the conversion layer 14 has CsI:Tl as a material, the coefficient of thermal expansion is 50 ppm/K. In this case, examples of the material relatively close to the conversion layer 14 include PVC, acrylic, PET, PC, Teflon (registered trademark), and the like. Moreover, considering the above-described bending elastic modulus, the material of the reinforcing layer 48 is more preferably a material containing at least one of PET or PC. Additionally, from the viewpoint of elasticity, the reinforcing layer 48 preferably contains a material having a yield point.

The reinforcing layer 48 of the present modification example is a substrate having plastic as a material. In a case where the plastic used as the material for the reinforcing layer 48 is preferably a thermoplastic resin for the above-described reasons, and include at least one of PC, PET, styrol, acrylic, polyacetase, nylon, polypropylene, ABS, engineering plastics, or polyphenylene ether. In addition, the reinforcing layer 48 is even more preferably at least one of polypropylene, ABS, engineering plastics, PET, or polyphenylene ether among these, is more preferably at least one of styrol, acrylics, polyacetase, or nylon, and is more preferably at least one of PC or PET.

In addition, the specific characteristics, materials, and the like of the reinforcing layer 48 and the reinforcing member 50 may be the same or different.

In a case where the conversion layer 14 is formed by the vapor-phase deposition method, as shown in FIGS. 10 and 3A, the conversion layer 14 is formed with an inclination such that the thickness thereof gradually decreases toward an outer edge thereof. In the following, a central region of the conversion layer 14 where the thickness in a case where manufacturing errors and measurement errors are neglected can be considered to be substantially constant is referred to as a central part. Additionally, an outer peripheral region of the conversion layer 14 having a thickness of, for example, 90% or less of the average thickness of the central part of the conversion layer 14 is referred to as a peripheral edge part. That is, the conversion layer 14 has an inclined surface that is inclined with respect to the sensor substrate 12 at the peripheral edge part. As shown in FIG. 10, the reinforcing layer 48 of the present modification example covers the entire central part and a partial peripheral edge part of the conversion layer 14. In other words, the outer edge of the reinforcing layer 48 is located on an inclined surface of the peripheral edge part of the conversion layer 14.

In addition, the position where the reinforcing layer 48 is provided is not limited to the present modification example. For example, a form may be adopted in which the reinforcing layer 48 covers the entire conversion layer 14. Additionally, for example, as shown in FIG. 10, in the present modification example, the reinforcing layer 48 is provided in a state of being bent along an inclined part of the conversion layer 14. However, the reinforcing layer 48 may be formed in a plate shape without bending in a state in which a space is provided between the inclined portion of the conversion layer 14 and the reinforcing layer 48.

By providing the reinforcing layer 48 on the conversion layer 14 in this way, the strength of the base material 11 is further reinforced.

Additionally, in the present modification example, by separately providing the reinforcing layer 48 and the stress neutral plane adjusting member 70, for example, the radiation detector 10 can be made lighter than that in a case where the stress neutral plane adjusting member 70 is extended to an upper portion of the conversion layer 14 and also have a function as the reinforcing layer 48.

Modification Example 5

Figure 11:
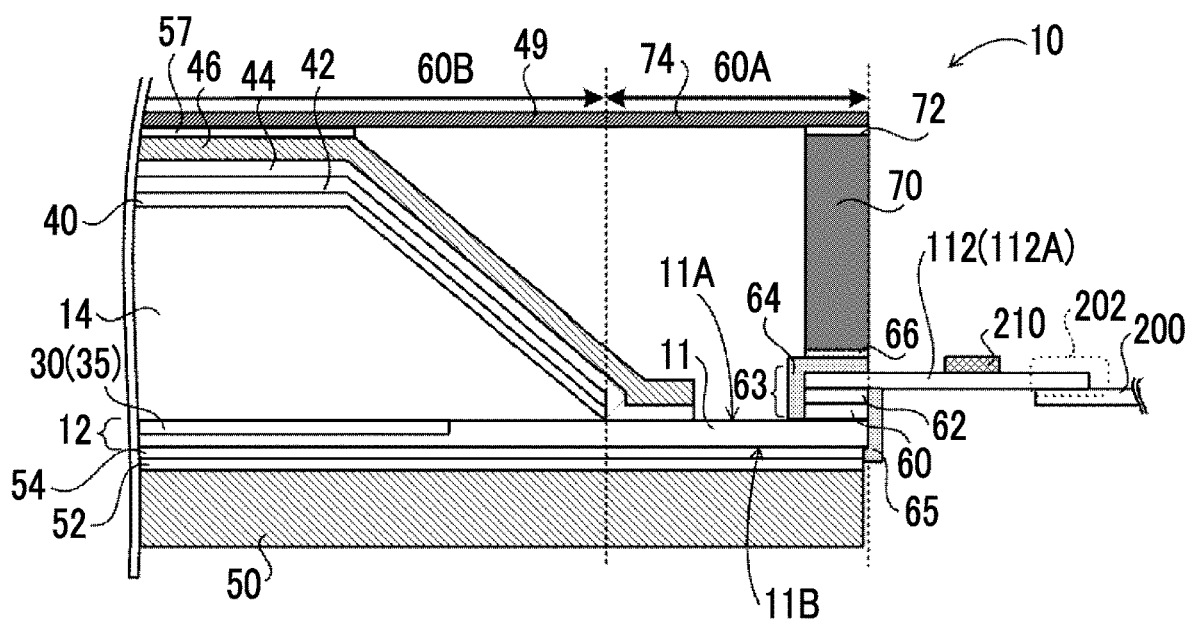
FIG. 11 is a cross-sectional view taken along line A-A of an example of a radiation detector of Modification Example 5.

FIG. 11 shows an example of a cross-sectional view of a radiation detector 10 of the present modification example, which corresponds to the sectional view taken along the line A-A of the radiation detector 10 illustrated in FIG. 3A.

As shown in FIG. 11, in the radiation detector 10 of the present modification example, the entire first surface 11A side of the sensor substrate 12 (base material 11) provided with the conversion layer 14, the laminate 63, and the stress neutral plane adjusting member 70 is covered with the protective film 49. As shown in FIG. 11, in the radiation detector 10 of the present modification example, the protective film 49 is provided on the conversion layer 14 by the pressure-sensitive adhesive layer 57, and the protective film 49 is provided on the stress neutral plane adjusting member 70 by the pressure-sensitive adhesive layer 72.

The protective film 49 is a film having a moistureproof function and having a relatively thin thickness. For example, the thickness is relatively small as compared to the reinforcing layer 48 in the radiation detector 10 of the above Modification Example 4. As the protective film 49, for example, moistureproof films, such as a Parylene (registered trademark), an insulating sheet (film) such as polyethylene terephthalate, and an ALPET (registered trademark) sheet can be used. In addition, the protective film 49 may have an antistatic function instead of the moistureproof function or together with the moistureproof function.

In this way, by covering the entire first surface 11A side of the sensor substrate 12 (base material 11) provided with the conversion layer 14, the laminate 63, and the stress neutral plane adjusting member 70 with the protective film 49, the moistureproofness of the entire radiation detector 10 is improved.

Additionally, according to the radiation detector 10 of the present modification example, since the stress neutral plane adjusting member 70 is connected to the conversion layer 14 by the protective film 49, the adjustment function of the stress neutral plane 71 by the stress neutral plane adjusting member 70 can be improved.

As described above, the radiation detector 10 of each of the above forms includes the sensor substrate 12, the conversion layer 14, the reinforcing member 50, and the stress neutral plane adjusting member 70. In the sensor substrate 12, the plurality of pixels 30 that accumulate electric charges generated in response to the light converted from the radiation are formed in the pixel region 35 of the first surface 11A of the flexible base material 11, and the terminal region 60A of the first surface 11A is provided with the terminal portion 60 for electrically connecting the cable 112. The conversion layer 14 is provided on the terminal region outside 60B on the first surface 11A of the base material 11 and converts the radiation R into light. The reinforcing member 50 is provided on the second surface 11B opposite to the first surface 11A of the base material 11 to reinforce the strength of the base material 11. The stress neutral plane adjusting member 70 is provided inside the terminal region 60A and in at least a part, corresponding to the inside of the terminal region 60A, of the cable 112 electrically connected to the terminal portion 60 and adjusts the position of the stress neutral plane 71 in the region corresponding to the laminate 63 in which the reinforcing member 50, the terminal portion 60 of the sensor substrate 12, and the cable 112 electrically connected to the terminal portion 60 are laminated.

In the radiation detector 10 using the flexible base material 11 for the sensor substrate 12, there is a case where the electrical connection between the terminal portion 60 and the cable 112 are easily disconnected due to the deflection of the sensor substrate 12 and the reinforcing member 50 by providing the reinforcing member 50.

In contrast, according to the radiation detectors 10 of the present embodiment and the above respective modification examples, the stress neutral plane adjusting member 70 is provided on the laminate 63. Therefore, the position of the stress neutral plane 71 can be set to the vicinity of the interface 67 where the terminal portion 60 and the conductive particles 62A of the connection layer 62 are in contact with each other. Accordingly, according to the radiation detectors 10 of the present embodiment and the above respective modification examples, the stress on the interface 67 can be reduced. Therefore, the terminal portion 60 and the conductive particles 62A of the connection layer 62 are less likely to be in a non-contact state.

Therefore, according to the radiation detectors 10 of the present embodiment and the above respective modification examples, it is possible to easily suppress the disconnection of the electrical connection between the terminal portion 60 and the cable 112. In particular, in the radiation detectors 10 of the present embodiment and the above respective modification examples, it is possible to suppress the disconnection of the electrical connection between the terminal portion 60 and the cable 112 even in a case where the sensor substrate 12 and the reinforcing member 50 are deflected.

In addition, the radiation detector 10 is not limited to the forms described in the present embodiment and the above respective modification examples. For example, in the above-described radiation detector 10, each of the stress neutral plane adjusting member 70 provided on the laminate 63 formed by the terminal portion 60 electrically connected to the cable 112A and the stress neutral plane adjusting member 70 provided on the laminate 63 formed by the terminal portion 60 electrically connected to the cable 112B may be a member made of the same material or a member made of a different material.

Figure 12:
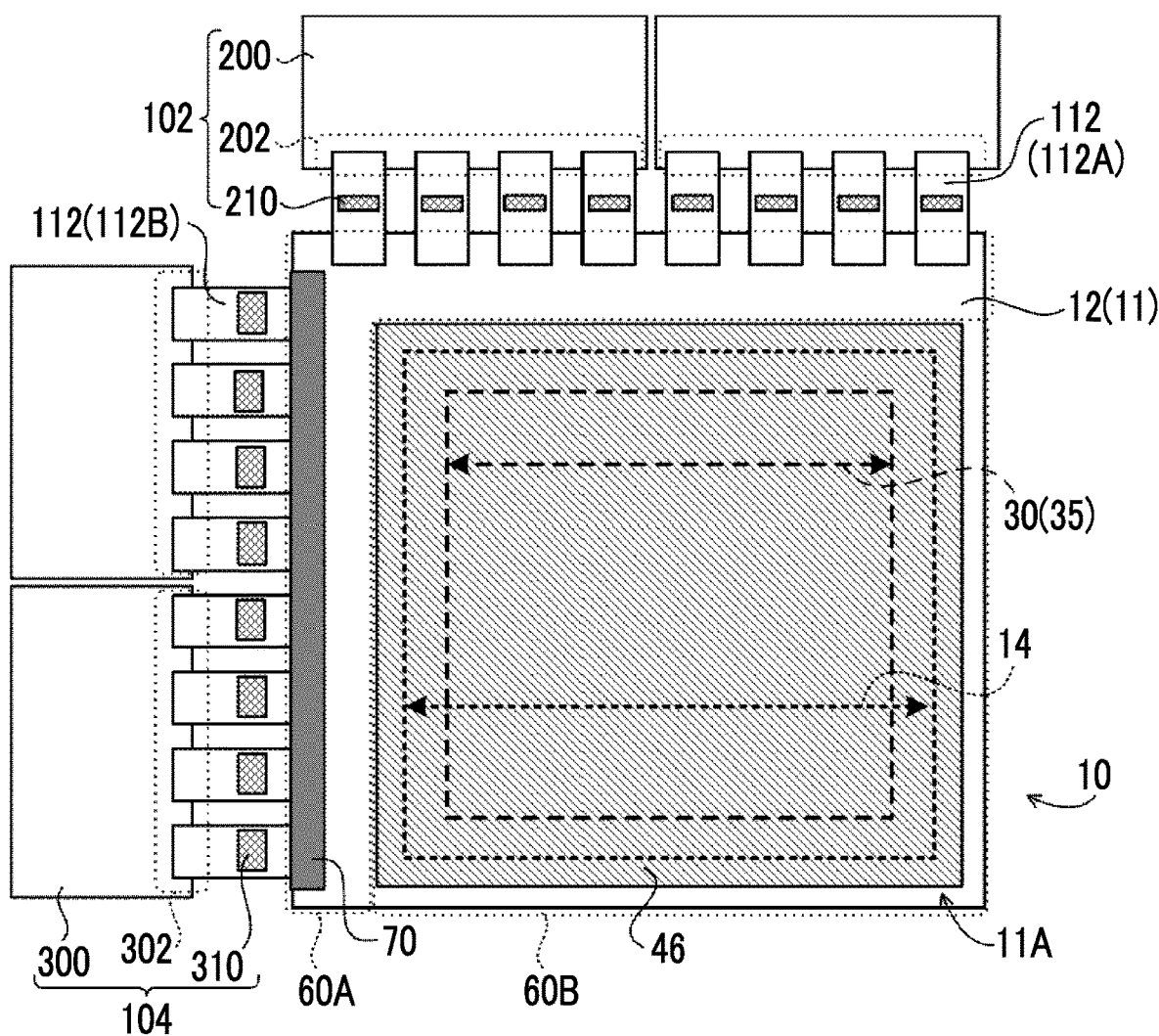
FIG. 12 is a plan view of another example of the radiation detector as viewed from the first surface side of the base material.

Additionally, in the above-described radiation detector 10, a form may be adopted in which the stress neutral plane adjusting members 70 are provided on both the laminate 63 formed by the terminal portion 60 electrically connected to the cable 112A and the laminate 63 formed by the terminal portion 60 electrically connected to the cable 112B. However, a form may be adopted in which the stress neutral plane adjusting member 70 is provided on only any one of the laminates. In this case, as shown in FIG. 12, since the analog components tend to be heavier than the digital components, it is preferable to provide the stress neutral plane adjusting member 70 with respect to the terminal portion 60 to which the cable 112B for being electrically connected to the signal processing substrate 300 and the signal processing IC 310, which are the analog components, are electrically connected.

Figure 13:
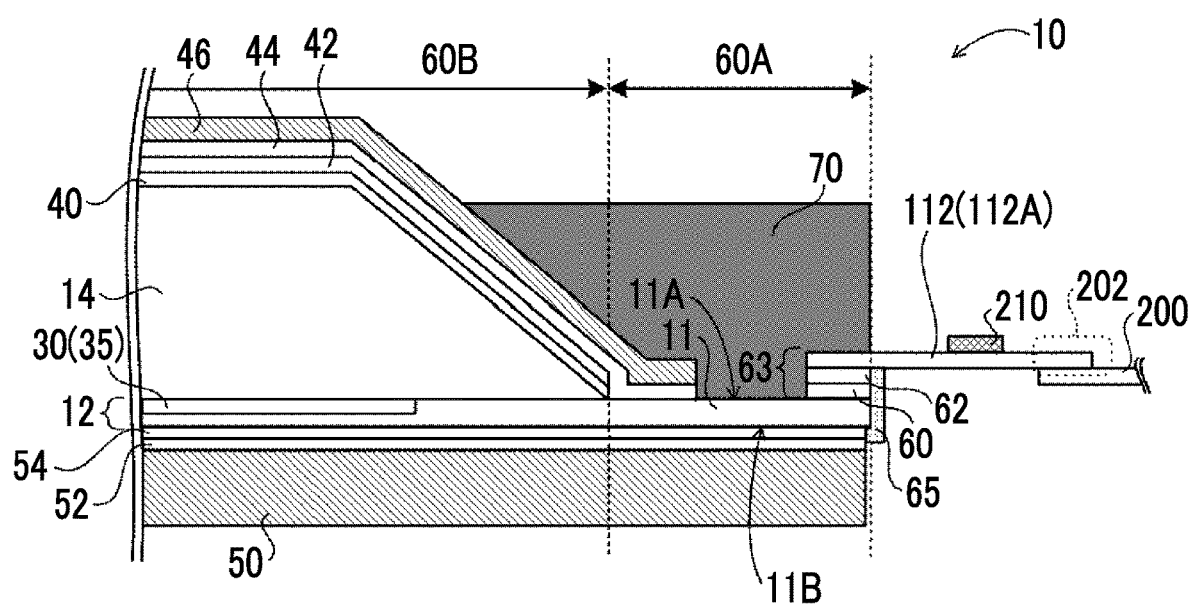
FIG. 13 is a cross-sectional view taken along line A-A of another example of the radiation detector.

Additionally, as in the example shown in FIG. 13, the stress neutral plane adjusting member 70 may be further provided in a state of being applied to the end portion of the conversion layer 14. As described above in Modification Example 2 (refer to FIG. 8B), in a case where the stress neutral plane adjusting member 70 has fluidity at the time of application, for example, like the above-described Tuffy (registered trademark), there is a case where the stress neutral plane adjusting member 70 is applied beyond the laminate 63, over the entire surface of the terminal region 60A, and further to the end portion of the conversion layer 14 as shown in FIG. 13. In this way, a form may be adopted in which the stress neutral plane adjusting member 70 is applied to the end portion of the conversion layer 14. In addition, the "end portion of the conversion layer 14" includes at least the inclined part of the above-described conversion layer 14, and may further include a region in the central part of the conversion layer 14 that reaches an outer edge with respect to a region corresponding to the pixel region 35.

Figure 14:
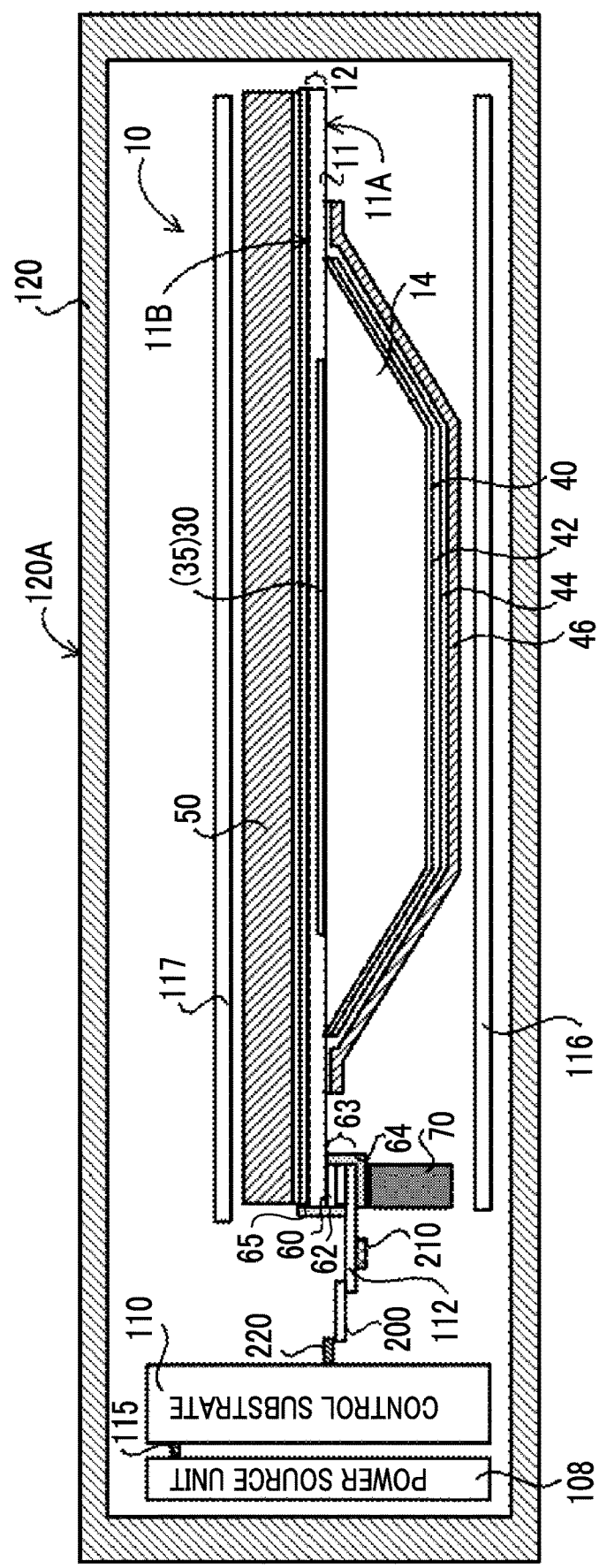
FIG. 14 is a cross-sectional view of an example of the radiographic imaging apparatus according to the embodiment housed in a housing.
Figure 15:
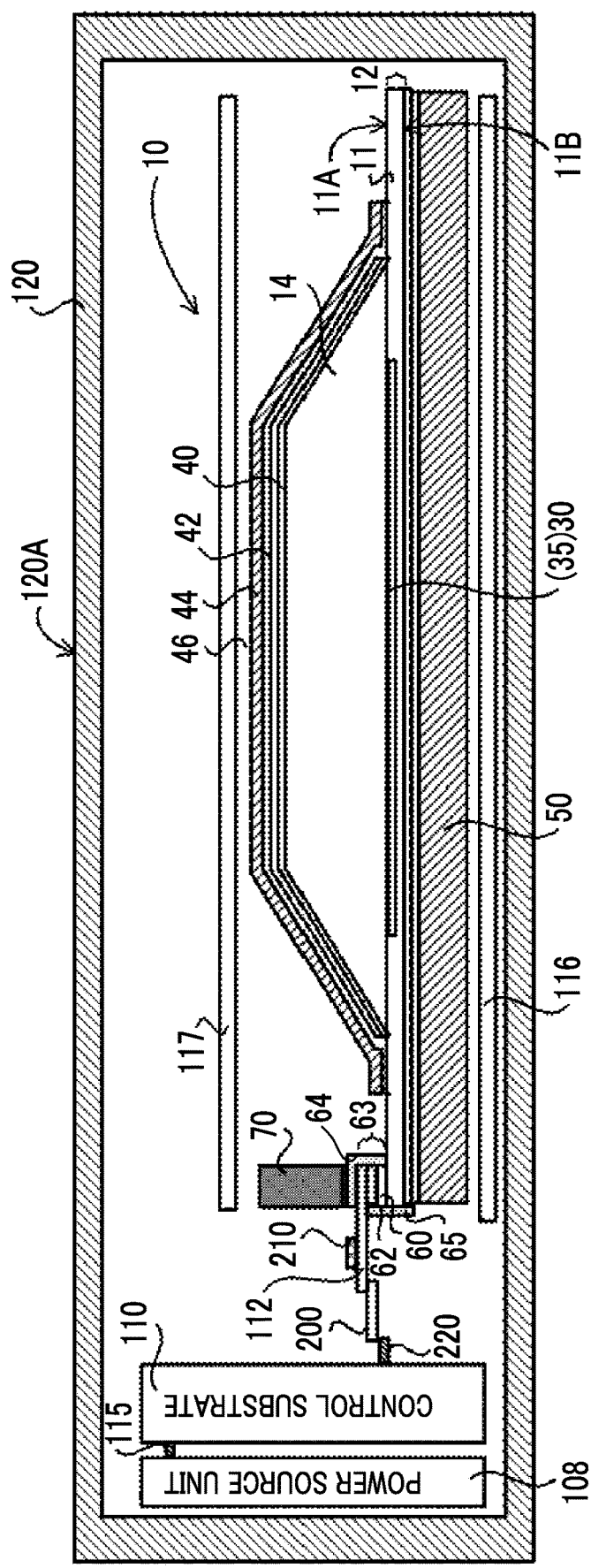
FIG. 15 is a cross-sectional view of another example of the radiographic imaging apparatus of the embodiment housed in the housing.

In addition, as shown in FIGS. 14 to 15, the radiographic imaging apparatuses 1 using the radiation detectors 10 and the like of the present embodiment and the respective modification examples is used in a state of being housed in the housing 120.

FIG. 14 shows a cross-sectional view of an example of an irradiation side sampling (ISS) type radiographic imaging apparatus 1 in which radiation is emitted from the second surface 11B side of the base material 11. As shown in FIG. 14, the radiation detector 10, the power source unit 108, and a control substrate 110 are provided side by side in a direction intersecting an incidence direction of radiation within the housing 120. The radiation detector 10 is disposed in a state in which the first surface 11A of the base material 11 in the sensor substrate 12 faces a top plate on an irradiation surface 120A side of the housing 120 that is irradiated with the radiation transmitted through a subject.

Additionally, FIG. 15 shows a cross-sectional view of an example of a penetration side sampling (PSS) type radiographic imaging apparatus 1 in which radiation is emitted from the conversion layer 14 side. As shown in FIG. 15, the radiation detector 10, the power source unit 108, and a control substrate 110 are provided side by side in a direction intersecting an incidence direction of radiation within the housing 120. The radiation detector 10 is disposed in a state in which the second surface 11B of the base material 11 in the sensor substrate 12 faces an irradiation surface 120A side of the housing 120 that is irradiated with the radiation transmitted through a subject.

The control substrate 110 and the driving substrate 200 are electrically connected to each other by a cable 220. Additionally, although the description is omitted in FIGS. 14 and 15, the control substrate 110 and the signal processing substrate 300 are electrically connected to each other by a cable.

Additionally, the control substrate 110 is connected to the power source unit 108, which supplies electrical power to the image memory 106, the controller 100, and the like that are formed in the control substrate 110, by a power source line 115.

A sheet 116 is further provided on a side from which the radiation transmitted through the radiation detector 10 is emitted, within the housing 120 of the radiographic imaging apparatus 1 shown in FIGS. 14 and 15. The sheet 116 is, for example, a copper sheet. The copper sheet does not easily generate secondary radiation due to incident radiation, and therefore, has a function of preventing scattering to the rear side, that is, the conversion layer 14 side. In addition, it is preferable that the sheet 116 covers at least an entire surface of the conversion layer 14 from which radiation is emitted, and covers the entire conversion layer 14.

Additionally, a protective layer 117 is further provided on a side (irradiation surface 120A side) on which radiation is incident, within the housing 120 of the radiographic imaging apparatus 1 shown in FIGS. 14 and 15. As the protective layer 117, moistureproof films, such as an ALPET (registered trademark) sheet obtained, a Parylene (registered trademark) film, and an insulating sheet, such as polyethylene terephthalate, can be applied to an insulating sheet (film). The protective layer 117 has a moistureproof function and an antistatic function with respect to the pixel region 35. For that reason, it is preferable that the protective layer 117 covers at least the entire surface of the pixel region 35 on the side on which radiation is incident, and it is preferable to cover the entire surface of the sensor substrate 12 on the side on which radiation is incident.

Figure 16:
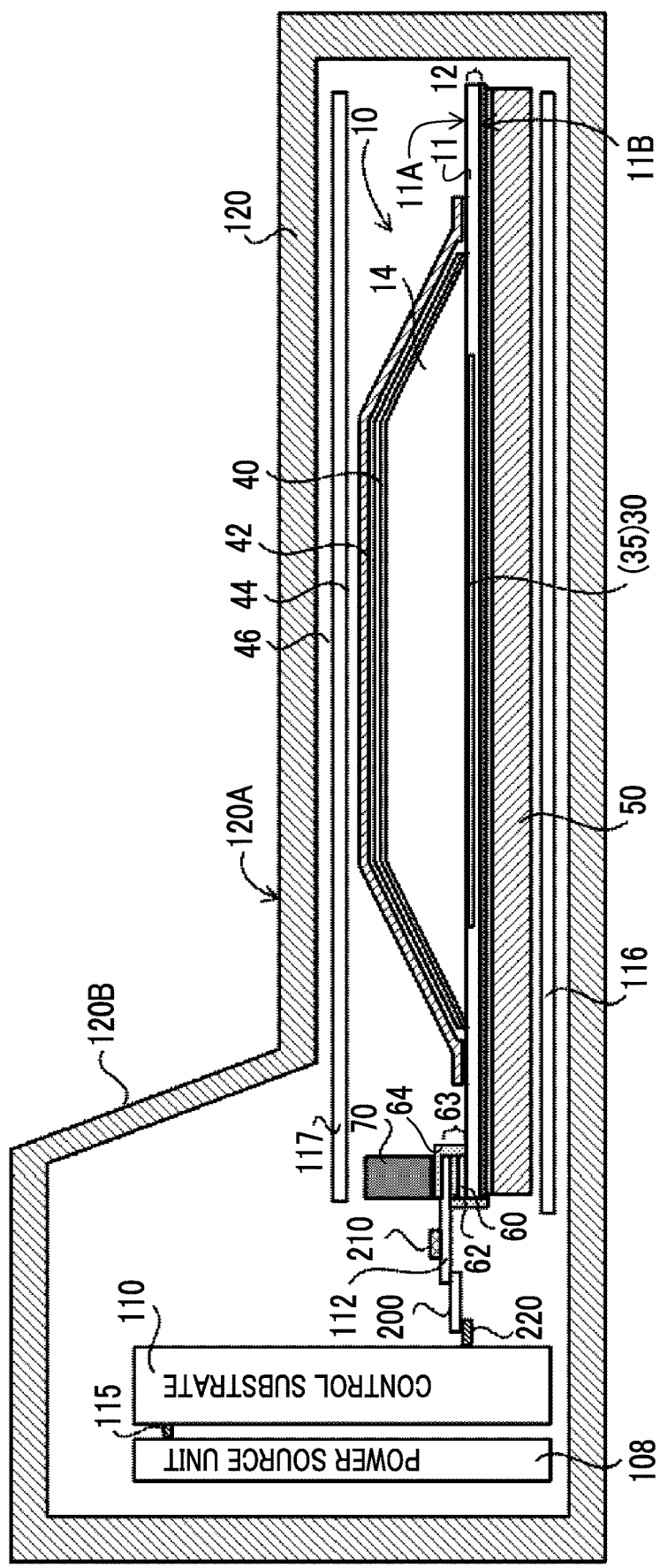
FIG. 16 is a cross-sectional view of another example of the radiographic imaging apparatus of the embodiment housed in the housing.

As shown in the example shown in FIGS. 14 and 15, there are many cases where each of the power source unit 108 and the control substrate 110 is thicker than the radiation detector 10. In such a case, as in the example shown in FIG. 16, the thickness of the portion of the housing 120 in which the radiation detector 10 is provided may be smaller than the thickness of the portion of the housing 120 in which each of the power source unit 108 and the control substrate 110 is provided. In addition, in this way, in a case where the thickness of the portion of the housing 120 in which each of the power source unit 108 and the control substrate 110 is provided and the thickness of the portion of the housing 120 in which the radiation detector 10 is provided are made different, and in a case where a step is generated at a boundary portion between the two portions, there is a concern that a sense of discomfort may be given to a subject who comes into contact with a boundary portion 120B. Therefore, the form of the boundary portion 120B is preferably in a state of having an inclination.

Accordingly, it is possible to construct an ultra-thin portable electronic cassette according to the thickness of the radiation detector 10.

Additionally, for example, in this case, the materials of the housing 120 may be different in the portion of the housing 120 in which each of the power source unit 108 and the control substrate 110 is provided and the portion of the housing 120 in which the radiation detector 10 is provided. Moreover, for example, the portion of the housing 120 in which each of the power source unit 108 and the control substrate 110 is provided and the portion of the housing 120 in which the radiation detector 10 is provided may be separated configured.

Additionally, as described above, the housing 120 is preferably made of a material having a low absorbance of radiation, particularly X-rays and a high stiffness, and is preferably made of a material having a sufficiently high elastic modulus. However, a portion corresponding to the irradiation surface 120A of the housing 120 may be made of a material having a low absorbance of the radiation, a high stiffness, and a sufficiently high elastic modulus, and the other portions may be made of a material different from the portion corresponding to the irradiation surface 120A, for example, a material having a lower elastic modulus than the portion of the irradiation surface 120A.

Additionally, in the above respective embodiments, as shown in FIG. 1, an aspect in which the pixels 30 are two-dimensionally arranged in a matrix has been described. However, the invention is not limited to the aspect, and for example, the pixels 30 may be one-dimensionally arranged or may be arranged in a honeycomb shape. Additionally, the shape of the pixels is also not limited, and may be a rectangular shape, or may be a polygonal shape, such as a hexagonal shape. Moreover, the shape of the pixel region 35 is also not limited.

In addition, it goes without saying that the configurations and manufacturing methods of the radiographic imaging apparatuses 1 and the radiation detectors 10 that are described in the above respective embodiments are merely examples, and can be changed in response to situations without departing from the scope of the present invention.

The disclosure of Japanese Patent Application No. 2019-127738 filed on Jul. 9, 2019 is incorporated in the present specification by reference in its entirety.

All documents, patent applications, and technical standards described in the present specification are incorporated in the present specification by reference in their entireties to the same extent as in a case where the individual documents, patent applications, and technical standards are specifically and individually written to be incorporated by reference.

What is claimed is:
1. A radiation detector comprising:
a substrate in which a plurality of pixels that accumulate electric charges generated in response to light converted from radiation are formed in a pixel region of a first surface of a flexible base material and a terminal region of the first surface is provided with a terminal portion for electrically connecting a cable;

a conversion layer that is provided outside the terminal region on the first surface of the base material to convert the radiation into light;

a reinforcing member that is provided on a second surface of the base material opposite to the first surface to reinforce strength of the base material; and a stress neutral plane adjusting member that is provided in at least a part, corresponding to an inside of the terminal region, of the cable electrically connected to the terminal portion and adjusts a position of a stress neutral plane in a region corresponding to a laminate in which the reinforcing member, the terminal portion of the substrate, and the cable electrically connected to the terminal portion are laminated.

2. The radiation detector according to claim 1, wherein the stress neutral plane adjusting member adjusts a position of the stress neutral plane in a lamination direction of the laminate to be within a predetermined range from an interface where the cable is electrically connected to the terminal portion.

3. The radiation detector according to claim 2, wherein the position to be within the predetermined range is a position in the laminate.

4. The radiation detector according to claim 1, wherein a bending stiffness of the stress neutral plane adjusting member is 540 Pacm$^4$ or more and 140,000 Pacm$^4$ or less.

5. The radiation detector according to claim 1, wherein the stress neutral plane adjusting member has a bending elastic modulus of 150 MPa or more and 2,500 MPa or less.

6. The radiation detector according to claim 1, wherein a plurality of the terminal portions are provided on the substrate, and the stress neutral plane adjusting member is provided over at least one or more of the terminal portions.

7. The radiation detector according to claim 1, further comprising:

a strengthening member that strengthening an electrical connection between the cable and the terminal portion, and the stress neutral plane adjusting member is provided on at least a part of the cable covered with the strengthening member.

8. The radiation detector according to claim 7, wherein the strengthening member further has moistureproofness.

9. The radiation detector according to claim 1, wherein the stress neutral plane adjusting member further strengthens an electrical connection between the cable and the terminal portion.

10. The radiation detector according to claim 9, wherein the stress neutral plane adjusting member further has moistureproofness.

11. The radiation detector according to claim 1, wherein the stress neutral plane adjusting member is further applied to an end portion of the conversion layer.

12. The radiation detector according to claim 1, further comprising:

a reinforcing layer that is provided on a surface of the conversion layer opposite to a surface on the base material side and has a higher stiffness than the base material.

13. A radiographic imaging apparatus comprising:

the radiation detector according to claim 1;

a controller that outputs a control signal for reading out the electric charges accumulated in the plurality of pixels;

a driver that is electrically connected to the terminal portion of the radiation detector via a cable and outputs a drive signal for reading out electric charges from the plurality of pixels in response to the control signal; and a signal processor that is electrically connected to the terminal portion of the radiation detector via the cable, receives electrical signals according to the electric charges read from the plurality of pixels, and generates image data according to the received electrical signals to output the image data.

14. The radiographic imaging apparatus according to claim 13, further comprising:

a housing that has an irradiation surface to be irradiated with radiation and houses the radiation detector in a state in which a sensor substrate among the sensor substrate and the conversion layer in the radiation detector faces the irradiation surface.

* * * * *